(12) United States Patent
Gambino et al.

(10) Patent No.: US 7,943,428 B2
(45) Date of Patent: May 17, 2011

(54) BONDED SEMICONDUCTOR SUBSTRATE INCLUDING A COOLING MECHANISM

(75) Inventors: Jeffrey P. Gambino, Westford, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 275 days.

(21) Appl. No.: 12/343,528

(22) Filed: Dec. 24, 2008

(65) Prior Publication Data
US 2010/0155932 A1    Jun. 24, 2010

(51) Int. Cl.
*H01L 21/48* (2006.01)
*H01L 21/50* (2006.01)
*H01L 21/76* (2006.01)
*H01L 21/30* (2006.01)

(52) U.S. Cl. . 438/118; 438/406; 438/455; 257/E21.122; 257/E21.567

(58) Field of Classification Search .......... 438/118, 438/406, 455; 257/E21.122, E21.567
See application file for complete search history.

(56) References Cited

U.S. PATENT DOCUMENTS

| | | | |
|---|---|---|---|
| 6,278,181 B1 * | 8/2001 | Maley | 257/712 |
| 7,230,334 B2 | 6/2007 | Andry et al. | |
| 7,282,793 B2 | 10/2007 | Akram | |
| 7,282,794 B2 | 10/2007 | Akram | |
| 2006/0125092 A1 * | 6/2006 | Marshall | 257/723 |
| 2009/0075456 A1 * | 3/2009 | Akimoto et al. | 438/458 |
| 2010/0044853 A1 * | 2/2010 | Dekker et al. | 257/692 |
| 2010/0090302 A1 * | 4/2010 | Nguyen Hoang et al. | 257/428 |
| 2010/0178722 A1 * | 7/2010 | de Graff et al. | 438/65 |
| 2010/0225006 A1 * | 9/2010 | Haba et al. | 257/774 |

OTHER PUBLICATIONS

Dang, Bing "Wafer-Level Microfluidic Cooling Interconnects for GSI", (School of Electrical and Computer Engineering, Georgia Institute of Technology, Microelectronics Research Center); Joseph, Paul; Bakir, Muhannad; Spencer, Todd; Kohl, Paul; Meindl, James Source: Proceedings of the IEEE 2005 International Interconnect Technology Conference, IITC, Proceedings of the IEEE 2005 International Interconnect Technology Conference, IITC, 2005, p. 180-182.

\* cited by examiner

*Primary Examiner* — Ngan Ngo
(74) *Attorney, Agent, or Firm* — Scully, Scott, Murphy & Presser, P.C.; Anthony J. Canale

(57) ABSTRACT

A bonded substrate comprising two semiconductor substrates is provided. Each semiconductor substrate includes semiconductor devices. At least one through substrate via is provided between the two semiconductor substrates to provide a signal path therebetween. The bottom sides of the two semiconductor substrate are bonded by at least one bonding material layer that contains a cooling mechanism. In one embodiment, the cooling mechanism is a cooling channel through which a cooling fluid flows to cool the bonded semiconductor substrate during the operation of the semiconductor devices in the bonded substrate. In another embodiment, the cooling mechanism is a conductive cooling fin with two end portions and a contiguous path therebetween. The cooling fin is connected to heat sinks to cool the bonded semiconductor substrate during the operation of the semiconductor devices in the bonded substrate.

2 Claims, 32 Drawing Sheets

BONDED SEMICONDUCTOR SUBSTRATE INCLUDING A COOLING MECHANISM

BACKGROUND

The present invention relates to bonded semiconductor substrates having a cooling mechanism at or near a bonding surface and design structures for the same.

Heat dissipation in a semiconductor chip is a major challenge to scaling of semiconductor devices because the power density, which is the product of areal device density and power consumption per device, of the semiconductor chip increases as the average area of the semiconductor decreases. Managing heat dissipation in a bonded semiconductor substrate, in which at least two semiconductor substrates each containing semiconductor devices are bonded, becomes even more problematic because the vertical stacking of the at least two semiconductor substrates further increases power dissipater per unit area.

While prior art methods provide methods of cooling a single semiconductor chip such as attaching a heat sink to the semiconductor chip and forming a cooling structure within a substrate, such methods require many processing steps for the manufacture of the cooling structure or provide inadequate cooling. Particularly, prior art methods do not provide inexpensive and effective cooling mechanisms for a bonded semiconductor substrate, within which heat is generated by semiconductor devices in at least two semiconductor substrates.

In view of the above, there exists a need for a semiconductor structure including a cooling mechanism for a bonded semiconductor substrate, and a design structure for the same.

SUMMARY

The present invention provides a structure, design structure and methods of forming a bonded semiconductor substrate having a cooling mechanism.

In the present invention, a bonded substrate comprising two semiconductor substrates is provided. Each semiconductor substrate includes semiconductor devices. At least one through substrate via is provided between the two semiconductor substrates to provide a signal path therebetween. The bottom sides of the two semiconductor substrate are bonded by at least one bonding material layer that contains a cooling mechanism. In one embodiment, the cooling mechanism is a cooling channel through which a cooling fluid flows to cool the bonded semiconductor substrate during the operation of the semiconductor devices in the bonded substrate. In another embodiment, the cooling mechanism is a conductive cooling fin with two end portions and a contiguous path therebetween. The cooling fin is connected to heat sinks to cool the bonded semiconductor substrate during the operation of the semiconductor devices in the bonded substrate.

According to an aspect of the present invention, a semiconductor structure is provided, which comprises:

a first semiconductor substrate including at least one first semiconductor device;

a second semiconductor substrate including at least one second semiconductor device and underlying the first semiconductor substrate; and a dielectric material layer located between the first semiconductor substrate and the second semiconductor substrate and including a contiguous cavity having a first lateral opening and a second lateral opening, wherein the first semiconductor substrate and the second semiconductor substrate are bonded through the dielectric material layer.

According to another aspect of the present invention, a semiconductor structure is provided, which comprises:

a first semiconductor substrate including at least one first semiconductor device;

a second semiconductor substrate including at least one second semiconductor device and underlying the first semiconductor substrate;

a dielectric material layer located between the first semiconductor substrate and the second semiconductor substrate, wherein the first semiconductor substrate and the second semiconductor substrate are bonded through the dielectric material layer; and a conductive fin having a first end portion and a second end portion and an embedded portion therebetween, wherein the embedded portion is embedded in the dielectric material layer.

According to yet another aspect of the present invention, a design structure embodied in a machine readable medium for designing, manufacturing, or testing a design for a semiconductor structure is provided. The design structure comprises:

a first data representing a first semiconductor substrate including at least one first semiconductor device;

a second data representing a second semiconductor substrate including at least one second semiconductor device and underlying the first semiconductor substrate;

a third data representing a dielectric material layer located between the first semiconductor substrate and the second semiconductor substrate, wherein the first semiconductor substrate and the second semiconductor substrate are bonded through the dielectric material layer;

a fourth data representing a contiguous cavity embedded in the dielectric material layer and having a first lateral opening and a second lateral opening;

a fifth data representing a through-substrate via that extends from above the at least one first semiconductor device to one of the at least one second semiconductor device;

an optional sixth data representing a cooling fluid filling the cavity;

an optional seventh data representing an inlet tube attached to the first lateral opening; and an optional eighth data representing an outlet tube attached to the second lateral opening.

According to still another aspect of the present invention, a design structure embodied in a machine readable medium for designing, manufacturing, or testing a design for a semiconductor structure is provided. The design structure comprises:

a first data representing a first semiconductor substrate including at least one first semiconductor device;

a second data representing a second semiconductor substrate including at least one second semiconductor device and underlying the first semiconductor substrate;

a third data representing a dielectric material layer located between the first semiconductor substrate and the second semiconductor substrate, wherein the first semiconductor substrate and the second semiconductor substrate are bonded through the dielectric material layer;

a fourth data representing a conductive fin having a first end portion and a second end portion and an embedded portion therebetween, wherein the embedded portion is embedded in the dielectric material layer; and a fifth data representing a through-substrate via that extends from above the at least one first semiconductor device to one of the at least one second semiconductor device.

In one embodiment, the fourth data represents a conductive fin having a planar top surface that is coplanar with a horizontal surface of the second dielectric material layer and a planar bottom surface that is coplanar with a horizontal surface of the second dielectric material layer, and the planar top surface is parallel to a bottom surface of the first semiconductor substrate and the planar bottom surface is parallel to a bottom surface of the second semiconductor substrate.

According to still another aspect of the present invention, a method of forming a semiconductor structure is provided, which comprises:

providing a first structure including a first semiconductor substrate having at least one first semiconductor device thereupon;

providing a second structure including a second semiconductor substrate having at least one second semiconductor device thereupon;

forming a first dielectric material layer directly on the first structure;

forming a second dielectric material layer directly on the second structure;

patterning the second dielectric material layer to form a contiguous channel having a first lateral opening and a second lateral opening; and bonding the first dielectric material layer and the second dielectric material layer.

According to still another aspect of the present invention, a method of forming a semiconductor structure is provided, which comprises:

providing a first structure including a first semiconductor substrate having at least one first semiconductor device thereupon;

providing a second structure including a second semiconductor substrate having at least one second semiconductor device thereupon;

forming a conductive fin directly on the second structure;

forming a second dielectric material layer directly on the second structure, wherein the conductive fin has a first end portion and a second end portion and an embedded portion therebetween, and wherein the embedded portion is embedded in the second dielectric material layer;

forming a first dielectric material layer directly on the first structure or directly on the second dielectric material layer; and bonding the first dielectric material layer and the second dielectric material layer.

DETAILED DESCRIPTION

Figure 1:
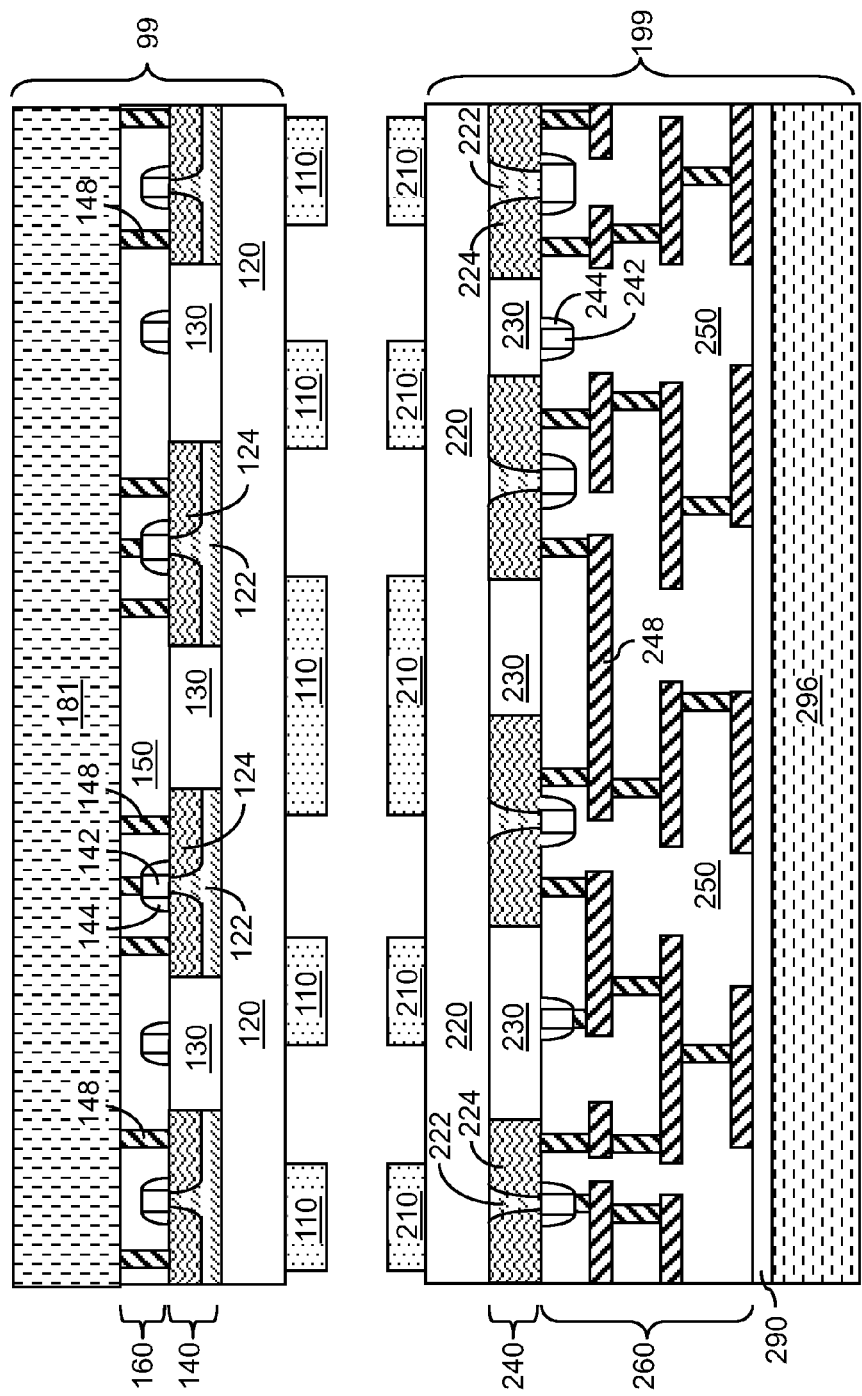
FIGS. 1, 2, 4-6 are sequential vertical cross-sectional views of a first exemplary semiconductor structure according to a first embodiment of the present invention at various stages of a manufacturing process.

As stated above, the present invention relates to bonded semiconductor substrates having a cooling mechanism at or near a bonding surface and design structures for the same, which are described herein with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIG. 1, a first exemplary semiconductor structure according to a first embodiment of the present invention comprises a first structure 99 derived from a first substrate (substrate 1) and a second structure 199, derived from a second substrate (substrate 2). The first structure 99 comprises a first semiconductor substrate 140 including at least one first semiconductor device. For example, the at least one first semiconductor device may include a first field effect transistor having a body region 122 and source and drain regions 124 in the first semiconductor substrate 140 and a gate electrode 142 and a gate spacer 144 directly on and above the first semiconductor substrate 140. The at least one first semiconductor device is electrically isolated from one another by at least one first shallow trench isolation structure 130 that extends from a top surface of the first semiconductor substrate 140 to a bottom surface of the first semiconductor substrate 140.

A portion of the at least one first semiconductor device is located within a semiconductor portion of the first semiconductor substrate 140, which comprises a semiconductor material. The semiconductor material may comprise silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material of the semiconductor portion of the first semiconductor substrate 140 comprises an epitaxial semiconductor material, i.e., a single crystalline semiconductor material having atomic alignment throughout the semiconductor material.

Optionally, a first insulator layer 120 may be provided directly underneath the first semiconductor substrate 140. The first insulator layer 120 comprises a dielectric material such as silicon oxide or silicon nitride. A substrate-contact level metal interconnect structure 160 is formed directly on the at least one first semiconductor device and the first semiconductor substrate 140. The substrate-contact level metal interconnect structure 160 includes a substrate-contact level dielectric layer 150. The substrate-contact level dielectric layer 150 comprises a dielectric material. The dielectric materials that may be used for the substrate-contact level dielectric layer 150 include, but are not limited to, a silicate glass, an organosilicate glass (OSG) material, a SiCOH-based low-k material formed by chemical vapor deposition, a spin-on glass (SOG), or a spin-on low-k dielectric material such as SiLK™, etc. The silicate glass includes an undoped silicate glass (USG), borosilicate glass (BSG), phosphosilicate glass (PSG), fluorosilicate glass (FSG), borophosphosilicate glass (BPSG), etc. The dielectric material may be a low dielectric constant (low-k) material having a dielectric constant less than 3.0. The dielectric material may non-porous or porous. First contact vias 148 that contact the at least one first semiconductor device and having a top surface coplanar with the top surface of the substrate-contact level dielectric layer 160 are formed within the substrate-contact level dielectric layer 150. First contact vias 148 comprise a conductive material such as W, Cu, Al, TaN, TiN, Ta, Ti, or a combination thereof.

A top handle substrate 181 is attached to the top surface of the substrate-contact level metal interconnect structure 160, for example, by bonding. The top handle substrate 180 may comprise a ceramic material, a semiconductor material, or a dielectric material such as glass or aluminum oxide. The top handle substrate 181 provides mechanical support to the stack of the first semiconductor substrate 140 and the substrate-contact level metal interconnect structure 160, and optionally, the first insulator layer 120, if present.

Insulator layer 120 could the insulator in a silicon-on-insulator (SOI) wafer, which was originally composed of a silicon handle wafer, an insulator, and a silicon layer on the surface. If a SOI wafer was used to form the structures on wafer 1, then the upper surface of wafer 1 would be temporarily attached to a top handle substrate 181 and the original silicon handle on the SOI wafer would be removed by a combination of etching or backside grinding, as known in the art. Alternatively, the stack of the first semiconductor substrate 140 and the substrate-contact level metal interconnect structure 160, and optionally, the first insulator layer 120, may be provided by cleaving a portion of a semiconductor substrate after attaching the top handle substrate 181 to the top surface of the substrate-contact level metal interconnect structure 160. For example, the first semiconductor substrate 140 and the first insulator layer 120 may be an upper portion of a semiconductor-on-insulator (SOI) layer, in which first semiconductor substrate 140 is a top semiconductor layer and the first insulator layer 120 is a buried insulator layer. Alternately, the first semiconductor substrate 140 may be a top portion of a bulk substrate, and the first insulator layer 120 may be absent in the first structure 99. In this case, the first semiconductor substrate 140 may be separated from the rest of the bulk substrate, for example, by backside grinding or backside etching the substrate, or cleaving at a hydrogen implanted surface.

The thickness of the first semiconductor substrate 140 may be from about 50 nm to about 200 µm, and typically from about 100 nm to about 20 µm, although lesser and greater thicknesses are contemplated herein. The thickness of the first insulator layer 120, if present, may be from about 100 nm to about 10 µm, and typically from about 200 nm to about 1.0 µm, although lesser and greater thicknesses are also contemplated herein. The thickness of the substrate-contact level metal interconnect structure 160 may be from about 200 nm to about 1.0 µm, although lesser and greater thicknesses are also contemplated herein. The thickness of the top handle substrate 181 may be from about 400 µm to about 2,000 µm, although lesser and greater thicknesses are also contemplated herein. The thickness of the first dielectric layer 110 may be from about 50 nm to about 5 µm, and typically from about 200 nm to about 2 µm, although lesser and greater thicknesses are also contemplated herein.

After flipping the first structure 99 upside down, a first dielectric layer 110 is applied to the bottom surface of the first insulator layer 120 or to the bottom surface of the first semiconductor substrate 140 if the first insulator layer 120 is not present. The first dielectric layer 110 comprises a bondable material that may be employed for bonding purposes, which may be a bondable dielectric oxide such as silicon oxide or a bondable polymer such as polyimide. The first dielectric layer 110 is lithographically patterned to include a contiguous channel embedded in the first dielectric layer 110 and having a first lateral opening at a first end of the contiguous channel and a second lateral opening at a second end of the contiguous channel. The stack of the first structure 99 and the first dielectric layer 110 is flipped upside down so that the first dielectric layer 110 is located underneath the first structure 99.

The second structure 199 comprises a second semiconductor substrate 240 including at least one second semiconductor device, which is shown upside down so that the top surface of the second semiconductor substrate 240 is shown below the bottom surface of the second semiconductor substrate 240. For example, the at least one second semiconductor device may include a second field effect transistor having a body region 222 and source and drain regions 224 in the second semiconductor substrate 240 and a gate electrode 242 and a gate spacer 244 directly on and beneath the first semiconductor substrate 140 as positioned upside down. The at least one second semiconductor device is electrically isolated from one another by at least one second shallow trench isolation structure 230 that extends from a top surface of the second semiconductor substrate 240 to a bottom surface of the second semiconductor substrate 240.

A portion of the at least one second semiconductor device is located within a semiconductor portion of the second semiconductor substrate 240, which comprises a semiconductor material. The semiconductor material in the second semiconductor substrate 240 may comprise any material that may be employed for the first semiconductor substrate 140 as described above. Typically, the semiconductor material of the second semiconductor substrate 240 comprises an epitaxial, polycrystalline, or monocrystalline semiconductor material.

Optionally, a second insulator layer 220 may be provided directly on the top surface of the second semiconductor substrate 240. The second insulator layer 220 comprises a dielectric material such as silicon oxide or silicon nitride, and may consist of the insulator portion of an SOI substrate, as in the substrate 99 discussed above. A second metal interconnect structure 260 is formed directly on the at least one first semiconductor device and the second semiconductor substrate 240 employing methods known in the art. The second metal interconnect structure 260 includes second interconnect level dielectric layers 250 and second metal wiring structures 248 embedded therein. The second interconnect level dielectric layers 250 may comprise any of the dielectric materials that may be employed for the substrate-contact level metal interconnect structure 160 as described above. A second passivation layer 290 is formed on the top surface of the second metal interconnect structure 260. The second passivation layer 290 comprises a dielectric material such as silicon oxide, silicon nitride, or a combination thereof.

A bottom handle substrate 296 is attached to the top surface of the passivation layer 290, for example, by bonding. The bottom handle substrate 296 is similar to handle substrate 181 and may comprise a ceramic material, a semiconductor material, or a dielectric material such as glass or aluminum oxide. The bottom handle substrate 296 provides mechanical support to the stack of the second semiconductor substrate 240 and the second metal interconnect structure 260, and optionally, the second insulator layer 220, if present.

The stack of the second semiconductor substrate 240 and the second metal interconnect structure 260, and optionally, the second insulator layer 220, may be provided in a similar fashion as the stack of the first semiconductor substrate 140 was, i.e., by cleaving a portion of a semiconductor substrate after attaching the bottom handle substrate 296 to the top surface of the passivation layer 290, or removing the slower silicon layer from an SOI substrate. For example, the second semiconductor substrate 240 and the second insulator layer 220 may be an upper portion of a semiconductor-on-insulator (SOI) layer, in which the second semiconductor substrate 240 is a top semiconductor layer and the second insulator layer 220 is a buried insulator layer. Alternately, the second semiconductor substrate 240 may be a top portion of a bulk substrate, and the second insulator layer 120 may be absent in the second structure 99. In this case, the second semiconductor substrate 240 may be separated from the rest of the bulk substrate, for example, by cleaving at a hydrogen implanted surface.

The thickness of the second semiconductor substrate 240 may be from about 50 nm to about 200 μm, and typically from about 100 nm to about 20 μm, although lesser and greater thicknesses are contemplated herein. The thickness of the second insulator layer 220, if present, may be from about 100 nm to about 10 μm, and typically from about 200 nm to about 1.0 μm, although lesser and greater thicknesses are also contemplated herein. The thickness of the second metal interconnect structure 260 may be from about 0.2 μm to about 20 μm, although lesser and greater thicknesses are also contemplated herein. The thickness of the bottom handle substrate 296 may be from about 400 μm to about 2,000 μm, although lesser and greater thicknesses are also contemplated herein. The thickness of the second dielectric layer 210 may be from about 50 nm to about 5 μm, and typically from about 200 nm to about 2 μm, although lesser and greater thicknesses are also contemplated herein.

The stack of the second semiconductor substrate 240 and second metal interconnect structure 260, and the second insulator layer 220, if present, are positioned upside down in the second structure 199. A second dielectric layer 210 is applied to the bottom surface of the second insulator layer 220 or to the bottom surface of the second semiconductor substrate 140 if the second insulator layer 220 is not present. The second dielectric layer 210 comprises a bondable material that may be employed for bonding purposes, which may be a bondable dielectric oxide such as silicon oxide or a bondable polymer such as polyimide. The second dielectric layer 210 is lithographically patterned to include a contiguous channel embedded in the second dielectric layer 210 and having a third lateral opening at a first end of the contiguous channel and a fourth lateral opening at a second end of the contiguous channel. In one case, the pattern in the second dielectric layer 210 is a mirror image of the pattern in the first dielectric layer 110.

Figure 2:
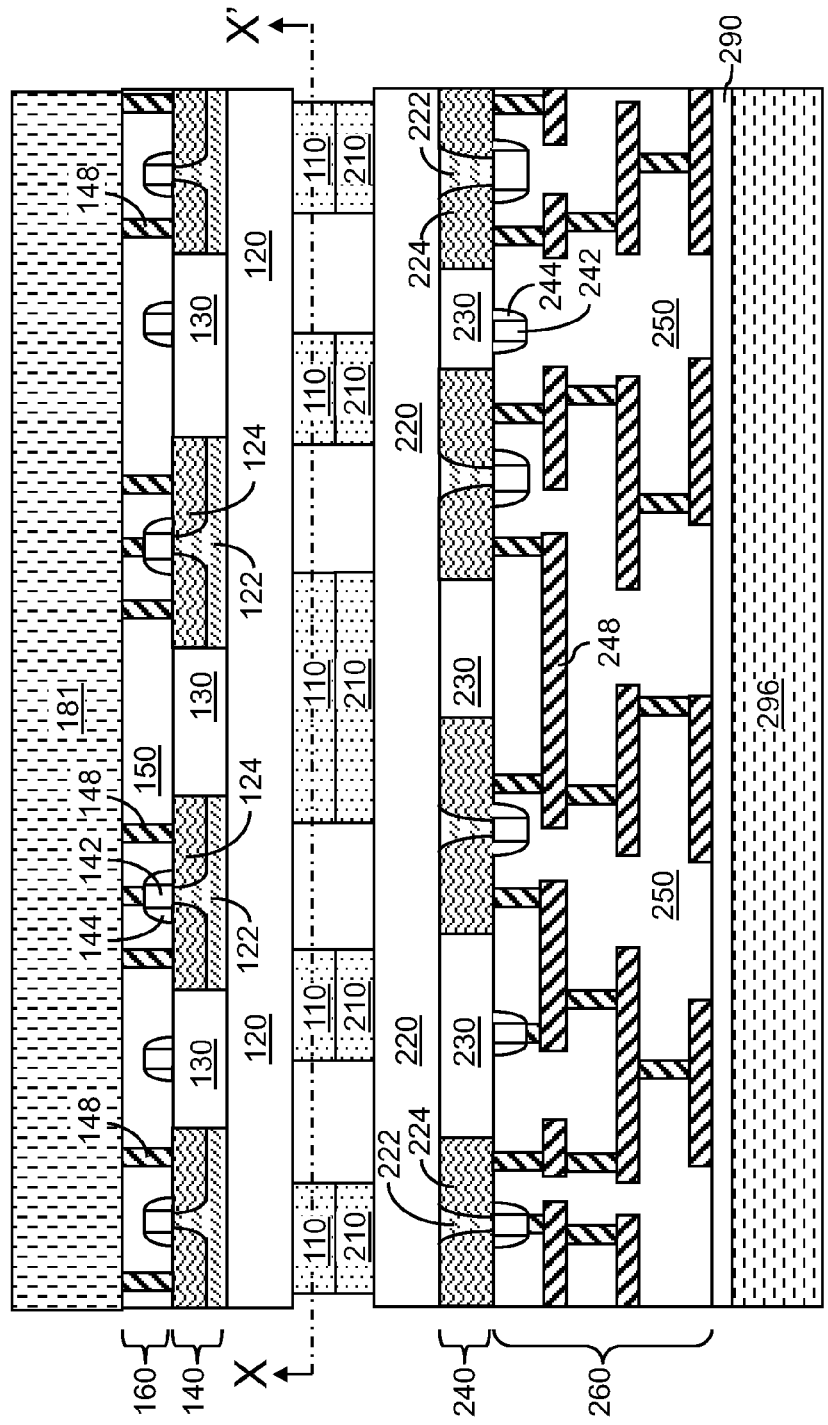
Figure 3:
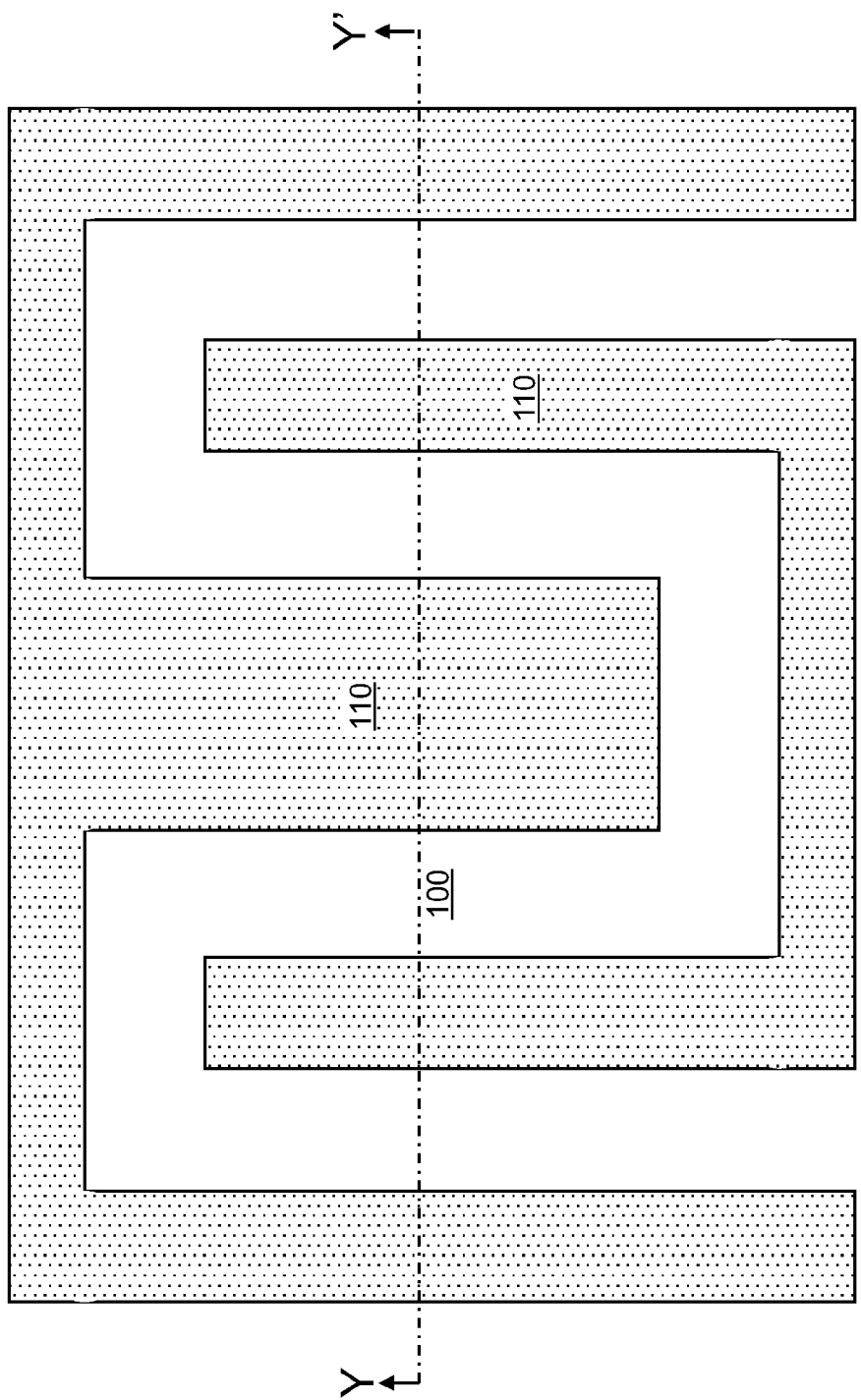
FIG. 3 is a horizontal cross-sectional view of the first exemplary semiconductor structure along the plane X-X' of FIG. 2. The plane Y-Y' in FIG. 3 represents the plane of the vertical cross-sectional view of FIG. 2.

Referring to FIGS. 2 and 3, the first structure 99 and the second structure 199 are bonded through the first dielectric layer 110 and the second dielectric layer 210. The first structure 99, the second structure 199, the first dielectric layer 110, and the second dielectric layer 210 collectively constitute a bonded substrate. The top surface of the second dielectric layer 210 is bonded to the top surface of the first dielectric layer 110 as positioned upside down. When the second dielectric layer 210 and the first dielectric layer 110 are brought together, the patterns in the second dielectric layer 210 and the first dielectric layer 110 are aligned so that the two channels form an contiguous cavity 100 vertically bounded by an upper surface of the first dielectric layer 110 and a lower surface of the second dielectric layer 210. The contiguous cavity 100 is laterally bounded by sidewalls of the first dielectric layer 110 and a lower surface of the second dielectric layer 210. The contiguous cavity 100 is provided with a first lateral opening at a first end of the contiguous cavity 100 and a second lateral opening at a second end of the contiguous cavity 100. The contiguous cavity 100 has a shape of a pipe, and may include bends. The contiguous cavity 100 is configured to be conducive to fluid flow between the first lateral opening and the second lateral opening, and may include regions having a constant cross-sectional area. The contiguous cavity 100 is "contiguous," i.e., in one connected volume. The vertical height of the contiguous cavity 100 may be from about 100 nm to about 10 μm, and typically from about 400 nm to about 4 μm, although lesser and greater thicknesses are also contemplated herein.

While the present invention is described with the first dielectric layer 110 and the second dielectric layer 210 that are bonded together so that the bonded interface is formed between the first dielectric layer 110 and the second dielectric layer 210, embodiments are explicitly contemplated in which only one of the first dielectric layer 110 and the second dielectric layer 210 is employed to bond the first structure 99 and the second structure 199. In this case, one of the first dielectric layer 110 and the second dielectric layer 210 containing a channel is vertically abutted by the first structure 99 and the second structure 199. In one embodiment, channel 100 has width and height of 10 um and 4 um, respectively. Although perfect alignment between layers 110 and 210 is shown in FIG. 2, layers 110 and 210 may have some misalignment due to overlay variations and width differences between the two layers.

Figure 4:
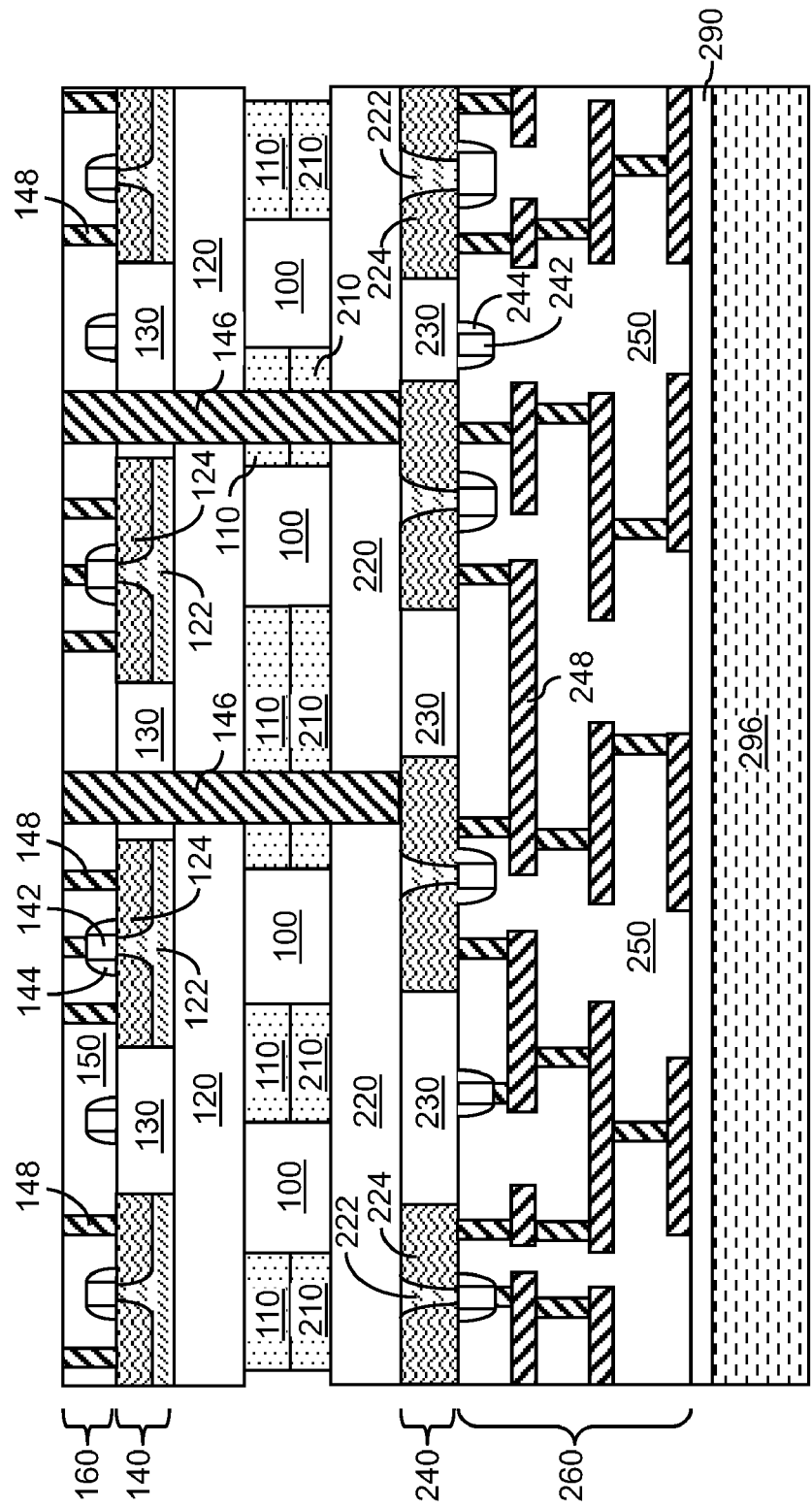

Referring to FIG. 4, the top handle substrate 181 is removed from the top surface of the substrate-contact level metal interconnect structure 160. Through-substrate via holes are formed from the top surface of the substrate-contact level metal interconnect structure 160 through the at least one shallow trench isolation structure 130 within the first semiconductor substrate 140, the first insulator layer 120 if present, the first dielectric layer 110, the second dielectric layer 210, and the second insulator layer 220 if present, to upper portions of the at least one second semiconductor device located in and beneath the second semiconductor substrate 240. For example, the through-substrate via holes may be formed to the source and drain regions 224 or the body region 222 of a field effect transistor located in and below the second semiconductor layer.

The through-substrate via holes are filled with a conductive material such as a doped semiconductor material or a metallic material to form conductive through-substrate vias 146. The excess conductive material above the top surface of the substrate-contact level metal interconnect structure 160 is removed, for example, by planarization. Exemplary semiconductor materials that may be employed for the through-substrate vias 146 include doped polycrystalline or amorphous silicon, germanium, silicon germanium, a metal (e.g., tungsten, titanium, tantalum, ruthenium, cobalt, copper, aluminum, lead, platinum, tin, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), carbon nanotube, conductive carbon, or any suitable combination thereof. The through substrate vias 146 extend from the above the at least one first semiconductor device in the first semiconductor layer 120, i.e., from the top surface of the substrate-contact level metal interconnect structure 160, to the at least one second semiconductor device.

Figure 5:
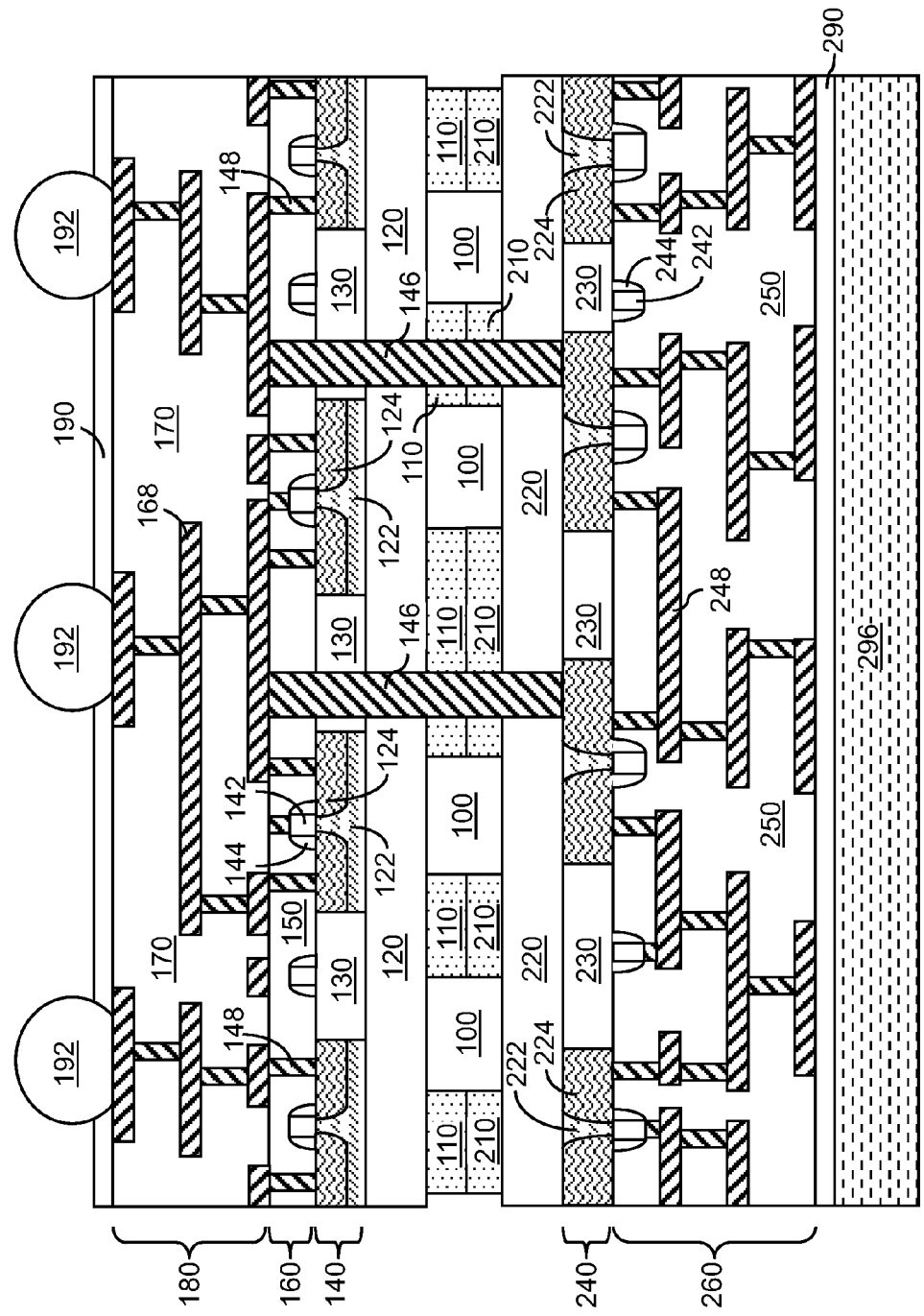

Referring to FIG. 5, a first metal interconnect structure 180 is formed directly on the substrate-contact level metal interconnect structure 160 employing methods known in the art. The first metal interconnect structure 180 includes first interconnect level dielectric layers 170 and first metal wiring structures 168 embedded therein. The first interconnect level dielectric layers 170 may comprise any of the dielectric materials that may be employed for the substrate-contact level metal interconnect structure 160 as described above. A first passivation layer 290 is formed on the top surface of the first metal interconnect structure 180. The first passivation layer 190 comprises a dielectric material such as silicon oxide, silicon nitride, or a combination thereof.

The first metal wiring structures 168 may include a first set of Controlled Collapse Chip Connection (C4) pads located directly underneath the first passivation layer 190. The first passivation layer 190 is lithographically patterned to expose the first set of C4 pads. A first set of C4 balls 192 are formed on the exposed first set of C4 pads. The first set of C4 balls 192 may then be bonded to a packaging substrate or another semiconductor chip including a set of C4 pads.

Figure 6:
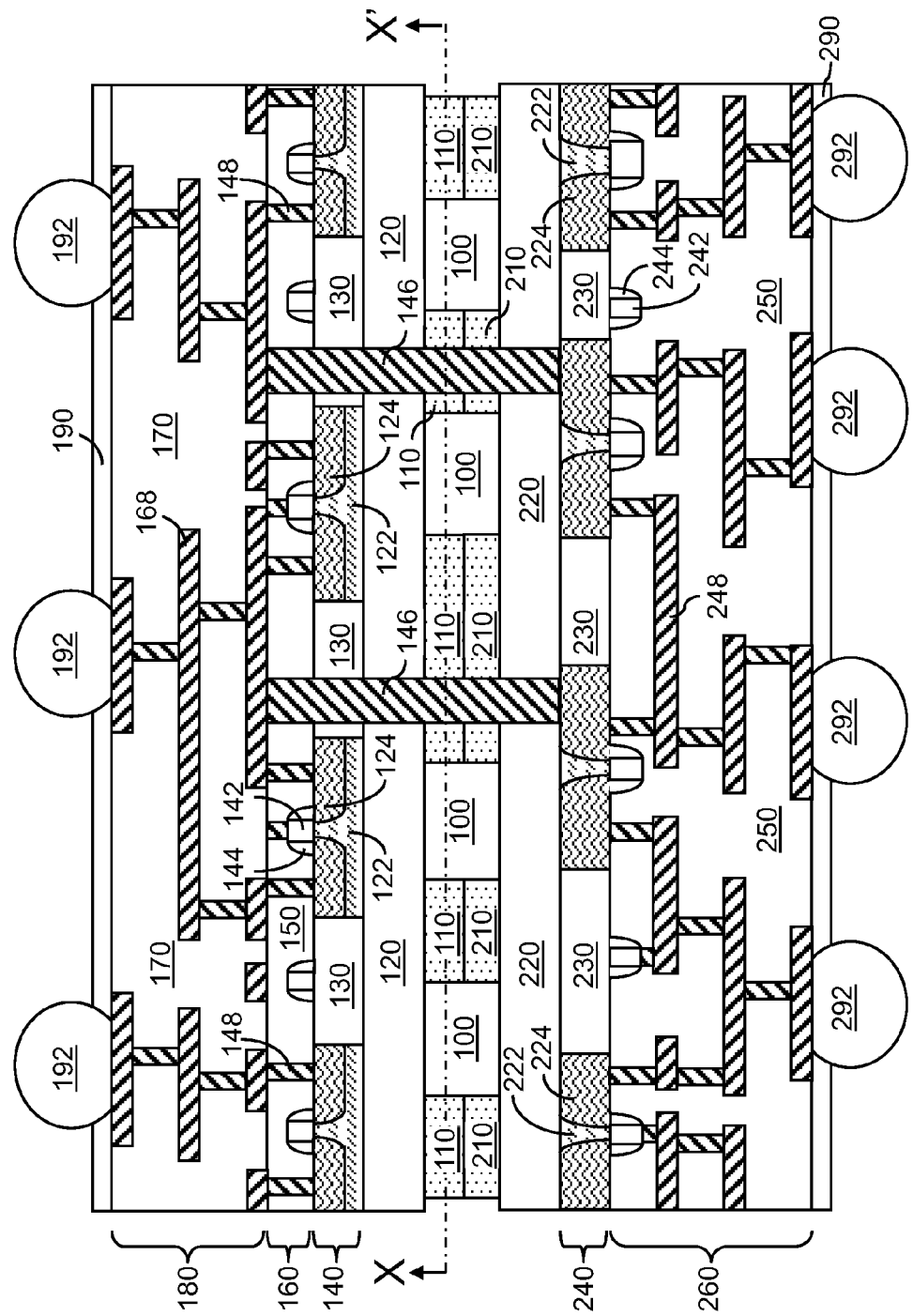
Figure 7:
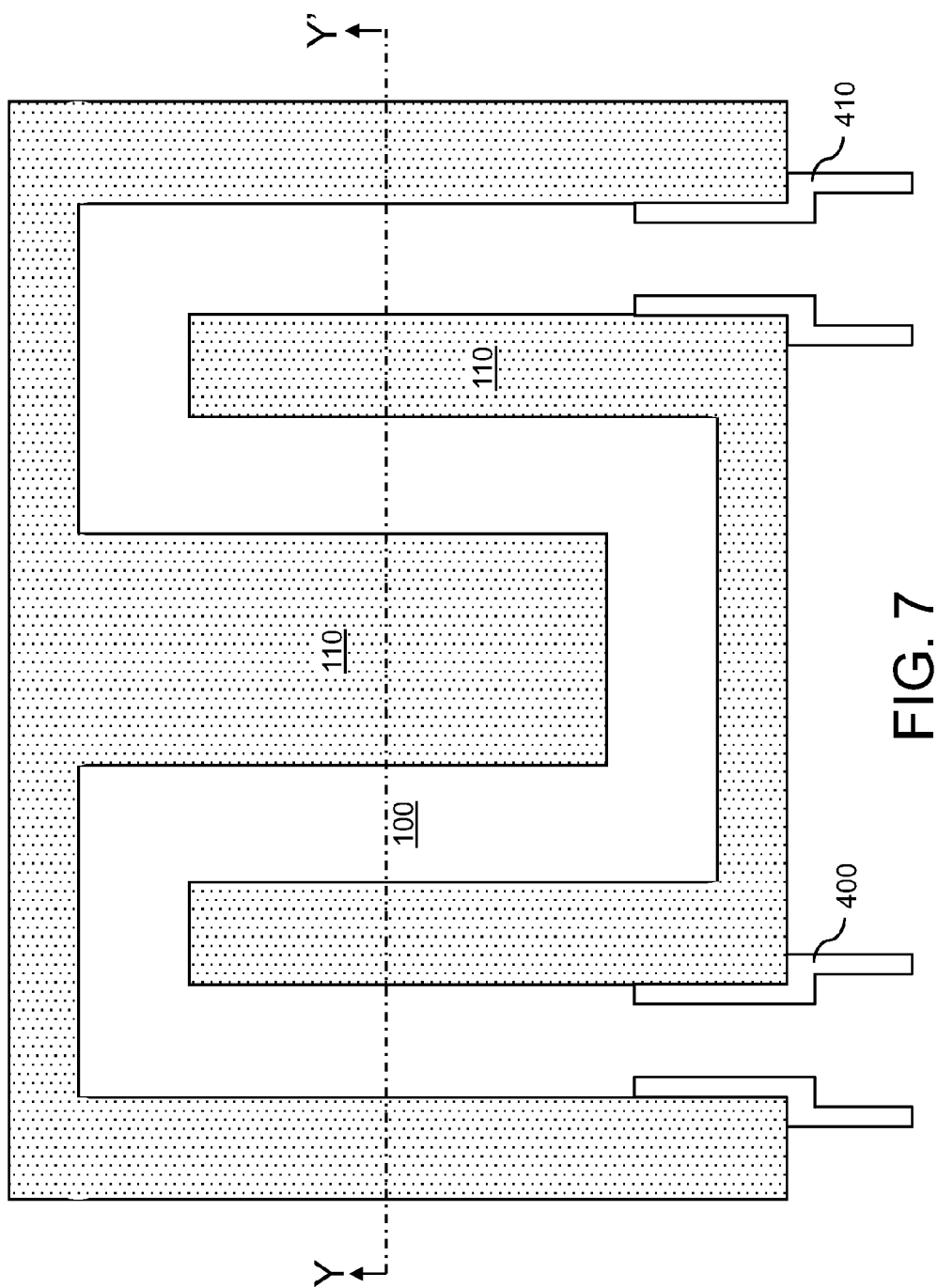
FIG. 7 is a horizontal cross-sectional view of the first exemplary semiconductor structure along the plane X-X' of FIG. 6. The plane Y-Y' in FIG. 7 represents the plane of the vertical cross-sectional view of FIG. 6.

Referring to FIGS. 6 and 7, the bottom handle substrate 296 is removed off the second passivation layer 290. The second metal wiring structures 248 may include a second set of C4 pads located directly above the second passivation layer 190. The second passivation layer 290 is lithographically patterned to expose the second set of C4 pads. A second set of C4 balls 292 are formed on the exposed second set of C4 pads. The second set of C4 balls 292 may then be bonded to a packaging substrate or yet another semiconductor chip including a set of C4 pads for further vertical stacking of semiconductor chips.

An inlet tube 400 may be attached to the first lateral opening of the contiguous cavity 100, and an outlet tube 410 may be attached to the second lateral opening of the contiguous cavity 100 to facilitate connection to a cooling fluid supply line (not shown) and a cooling fluid return line (not shown), which are connected to a cooling fluid circulator (not shown) and an optional heat radiator. A cooling fluid is supplied into the contiguous cavity 100 and circulated through the contiguous cavity 100 during operation of the semiconductor devices in the bonded semiconductor substrate, which may include, from top to bottom, the first set of C4 pads, the first passivation layer 190, the first metal interconnect structure 180, the substrate-contact level metal interconnect structure 160, the first semiconductor substrate 140, the first insulator layer 120, the first dielectric layer 110, the second dielectric layer 210, the second insulator layer 220, the second semiconductor substrate 240, the second metal interconnect structure 260, the second passivation layer 290, and the second set of C4 pads 292.

The cooling fluid may comprise any fluid that may be circulated to transfer heat. The cooling fluid may be a liquid or a gas. Exemplary materials for the cooling fluid include, but are not limited to, liquid helium, liquid hydrogen, liquid nitrogen, liquid oxygen, water, glycerin, methyl alcohol, ethyl alcohol, isopropyl alcohol, water, an antifreeze solution, a mineral oil, a castor oil, a silicone oil, a fluorocarbon oil, a transformer oil, a cutting lubricant, a refrigerant, air, nitrogen gas, oxygen gas, an inert gas, a halomethane, anhydrous ammonia, sulfur dioxide, carbon dioxide, and a non-reactive combination thereof.

Figure 8:
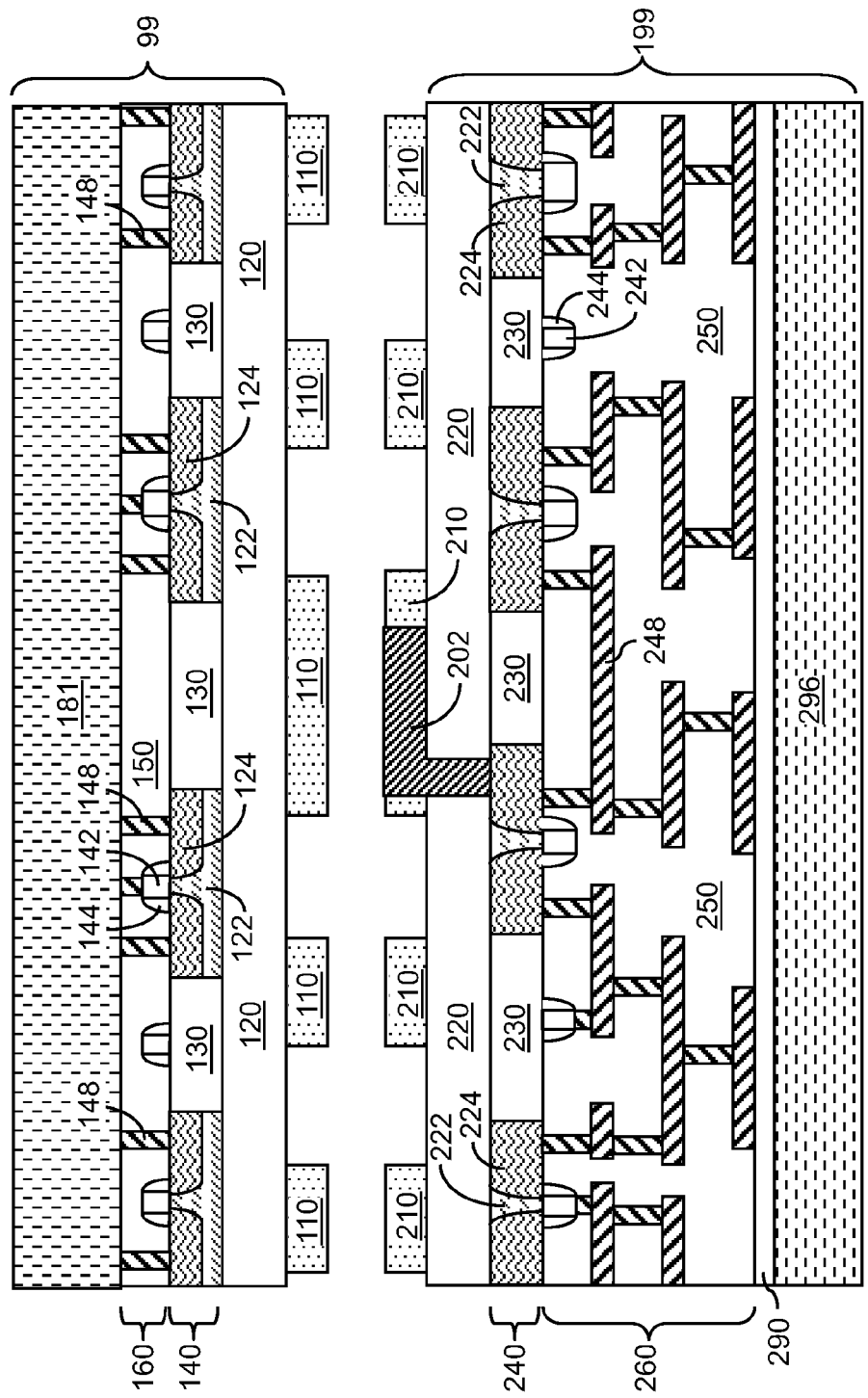
FIGS. 8, 9, 11-13 are sequential vertical cross-sectional views of a second exemplary semiconductor structure according to a second embodiment of the present invention at various stages of a manufacturing process.

Referring to FIG. 8, a second exemplary structure according to a second embodiment of the present invention comprises a first structure 99 and a second structure 199, which may be the same as in the first embodiment. After flipping the first structure 99 upside down, a first dielectric layer 110 is applied to the bottom surface of the first insulator layer 120 or to the bottom surface of the first semiconductor substrate 140 in the same manner as in the first embodiment. The first dielectric layer 110 comprises a bondable material that may be employed for bonding purposes. The first dielectric layer 110 is lithographically patterned to include a contiguous channel embedded in the first dielectric layer 110 and having a first lateral opening at a first end of the contiguous channel and a second lateral opening at a second end of the contiguous channel. The stack of the first structure 99 and the first dielectric layer 110 is flipped upside down so that the first dielectric layer 110 is located underneath the first structure 99.

A bottom handle substrate 296 is attached to the top surface of the passivation layer 290, for example, by bonding, in the same manner as in the first embodiment. At least one conductive structure 202 is then formed on the second insulator layer 220. The at least one conductive structure 202 is formed by lithographic patterning of at least one via hole in the second insulator layer 220 that extends to a top portion of the at least one second semiconductor device in and beneath the second semiconductor substrate 240. For example, the at least one via hole may extend to an upper surface of the second semiconductor substrate 240, which is the bottom surface of the second semiconductor substrate 240 as positioned upside down. A conductive material is deposited into the at least one via hole and on the upper surface of the second insulator layer 220 or the second semiconductor substrate 240. The conductive material may be a doped semiconductor material such as doped polysilicon or a doped silicon-containing alloy, or may be a metallic material such as W, Cu, Al, TaN, TiN, Ta, Ti, etc. The conductive material is lithographically patterned above the upper surface of the second insulator layer 220 to form the at least one conductive structure 202. The thickness of the at least one conductive structure 202 may be from about 50 nm to about 5 μm, and typically from about 200 nm to about 2 μm, although lesser and greater thicknesses are also contemplated herein.

A second dielectric layer 210 is applied over the second insulator layer 220 or the first semiconductor substrate 140. The second dielectric layer 210 may be subsequently planarized so that the top surface of the second dielectric layer 210 is substantially coplanar with the top surface(s) of the at least one conductive structure 202. The second dielectric layer 210 comprises a bondable material that may be employed for bonding purposes as in the first embodiment. The second dielectric layer 210 is lithographically patterned to include a contiguous channel embedded in the second dielectric layer 210 and having a third lateral opening at a first end of the contiguous channel and a fourth lateral opening at a second end of the contiguous channel. Each of the at least one conductive structure 202 is laterally embedded in the second dielectric layer 210. In one case, the pattern in the second dielectric layer 210 is a mirror image of the pattern in the first dielectric layer 110 so that the sidewalls of the second dielectric layer 210 and the first dielectric layer 110 are substantially vertically coincident when the second dielectric layer 210 and the first dielectric layer 110 are brought together.

Figure 9:
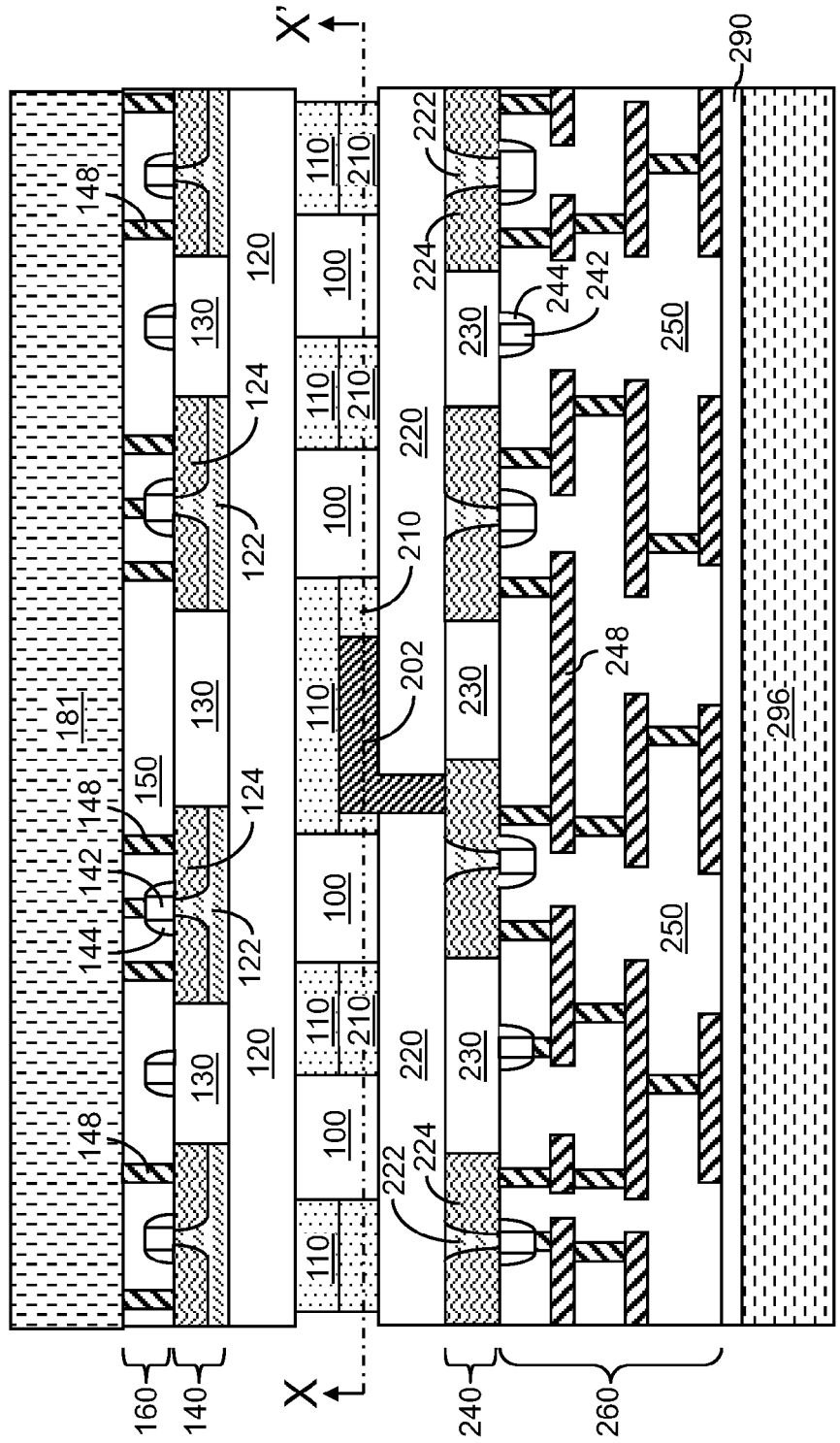
Figure 10:
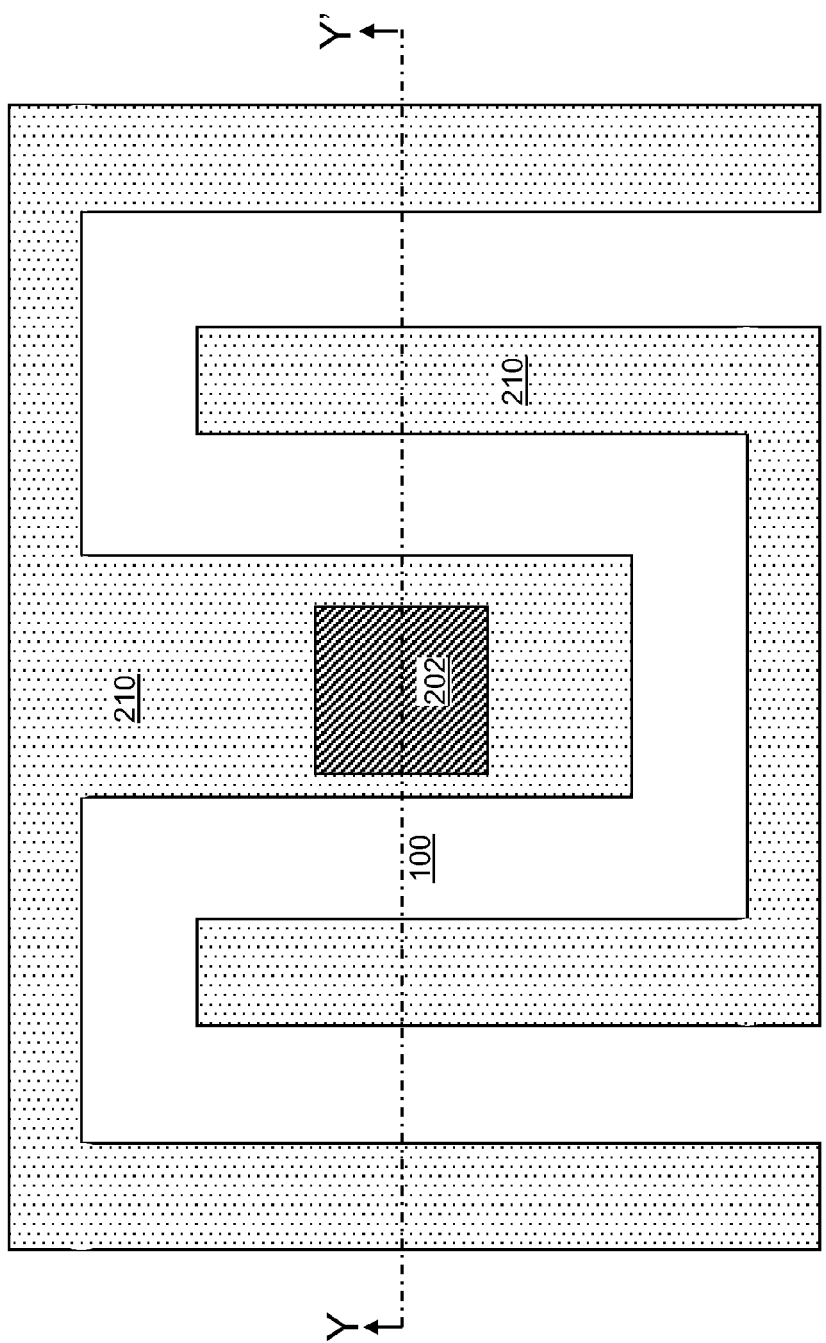
FIG. 10 is a horizontal cross-sectional view of the second exemplary semiconductor structure along the plane X-X' of FIG. 9. The plane Y-Y' in FIG. 10 represents the plane of the vertical cross-sectional view of FIG. 9.

Referring to FIGS. 9 and 10, the first structure 99 and the second structure 199 are bonded through the first dielectric layer 110 and the second dielectric layer 210 in the same manner as in the first embodiment. The first structure 99, the second structure 199, the first dielectric layer 110, and the second dielectric layer 210 collectively constitute a bonded substrate. The top surface of the second dielectric layer 210 is bonded to the top surface of the first dielectric layer 110 as positioned upside down. When the second dielectric layer 210 and the first dielectric layer 110 are brought together, the patterns in the second dielectric layer 210 and the first dielectric layer 110 are aligned so that the two channels form an contiguous cavity 100 vertically bounded by an upper surface of the first dielectric layer 110 and a lower surface of the second dielectric layer 210. The contiguous cavity 100 is laterally bounded by sidewalls of the first dielectric layer 110 and a lower surface of the second dielectric layer 210. The contiguous cavity 100 has the same geometric features as the continuous cavity 100 in the first embodiment. Embodiments are explicitly contemplated in which only one of the first dielectric layer 110 and the second dielectric layer 210 is employed to bond the first structure 99 and the second structure 199.

Figure 11:
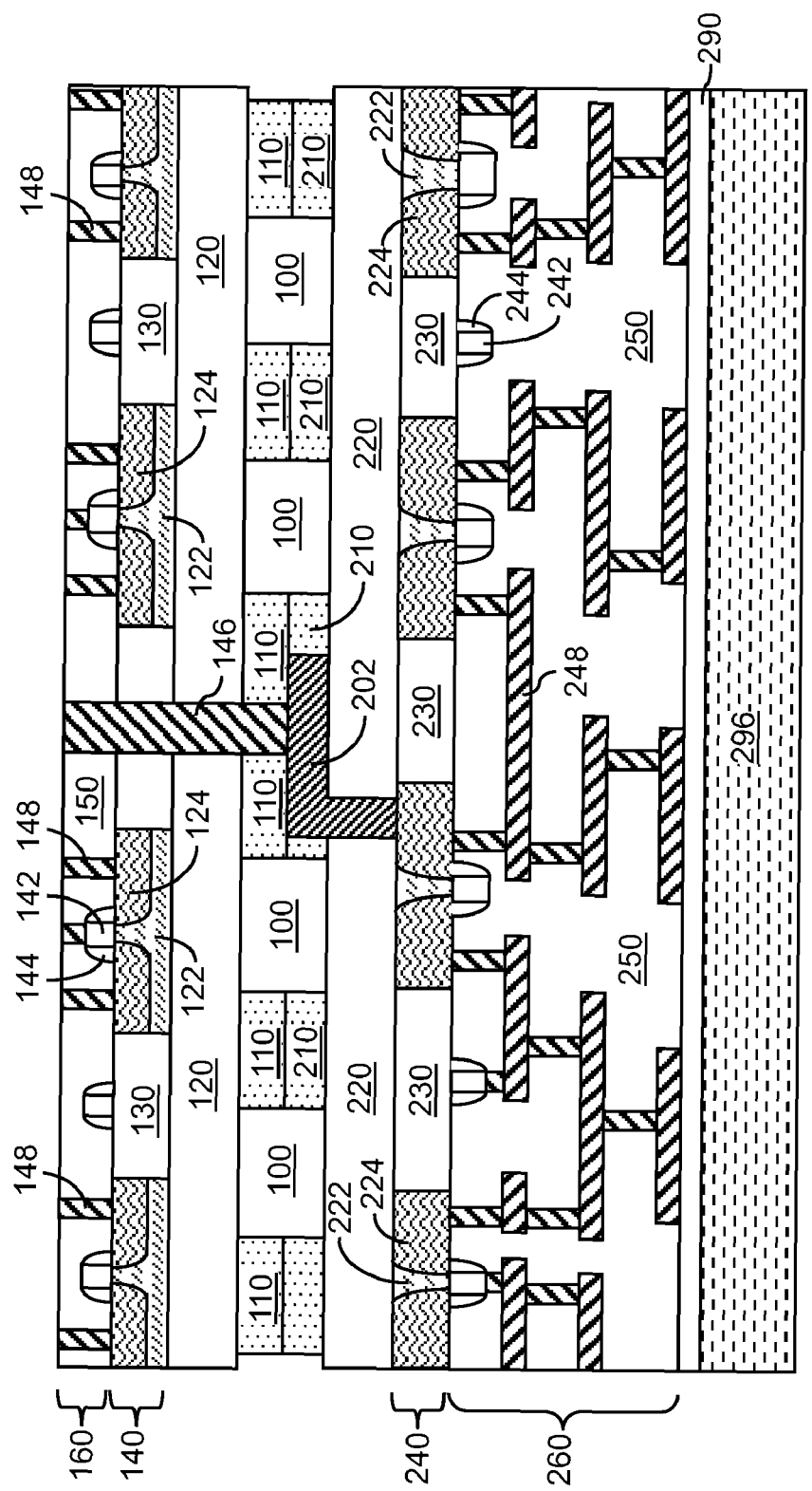

Referring to FIG. 11, the top handle substrate 181 is removed from the top surface of the substrate-contact level metal interconnect structure 160. Through-substrate via holes are formed from the top surface of the substrate-contact level metal interconnect structure 160 through the at least one shallow trench isolation structure 130 within the first semiconductor substrate 140, the first insulator layer 120 if present, and the first dielectric layer 110, to upper portions of the at least one conductive structure 202 embedded in the second dielectric layer 210.

The through-substrate via holes are filled with a conductive material such as a doped semiconductor material or a metallic material to form through-substrate vias 146. The excess conductive material above the top surface of the substrate-contact level metal interconnect structure 160 is removed, for example, by planarization. The through-substrate vias 146 may comprise the same material as in the first embodiment. The through substrate vias 146 extend from the above the at least one first semiconductor device in the first semiconductor layer 120, i.e., from the top surface of the substrate-contact level metal interconnect structure 160, to the at least one conductive structure 202. The through substrate vias 146 and the at least one conductive structure 202 collectively constitute conductive electrical connections between the at least one first semiconductor device and the at least one second semiconductor device.

Figure 12:
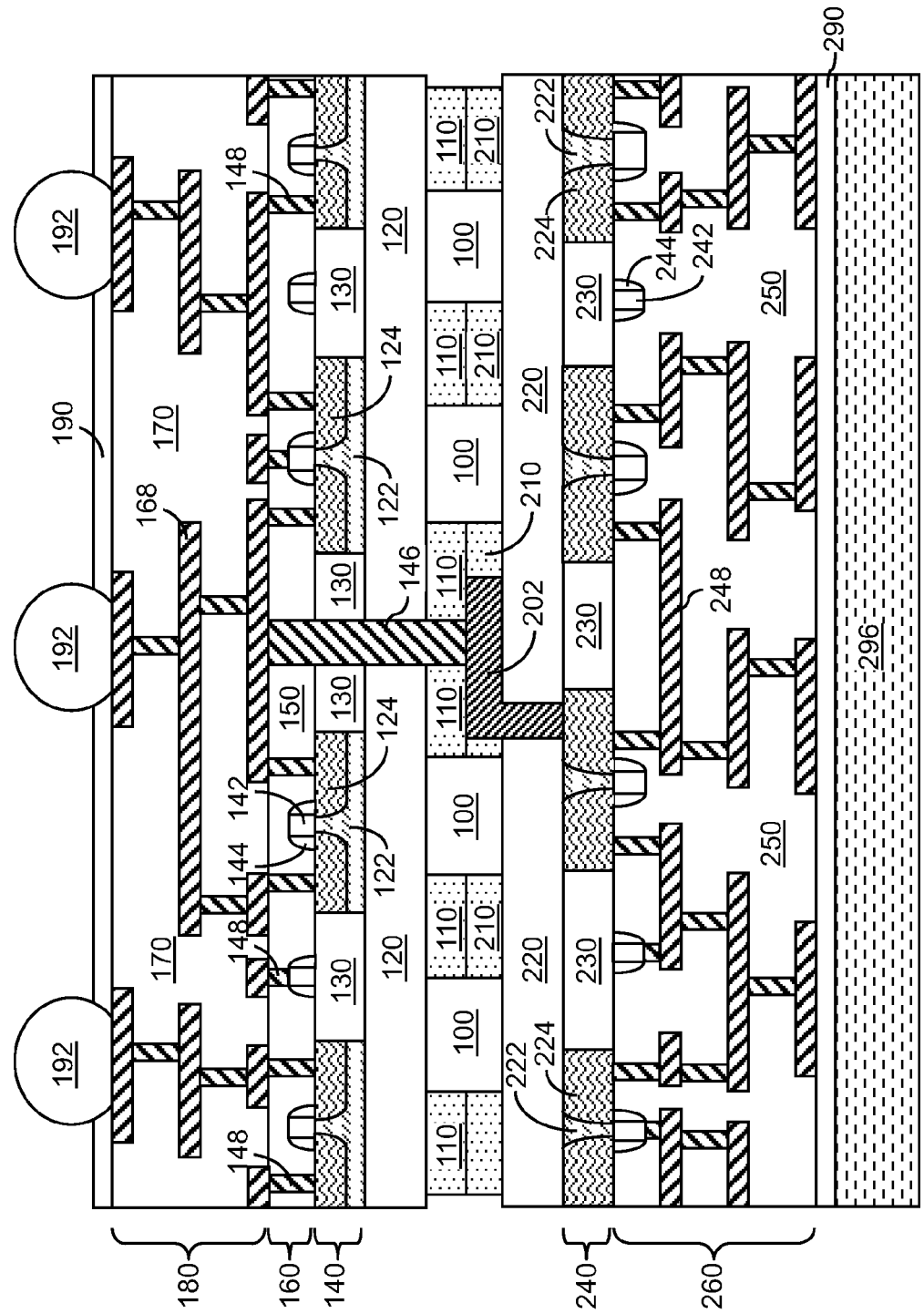

Referring to FIG. 12, a first metal interconnect structure 180 is formed directly on the substrate-contact level metal interconnect structure 160 in the same manner as in the first embodiment. The first metal wiring structures 168 may include a first set of Controlled Collapse Chip Connection (C4) pads located directly underneath the first passivation layer 190 as in the first embodiment. A first set of C4 balls 192 may be formed on the exposed first set of C4 pads as in the first embodiment.

Figure 13:
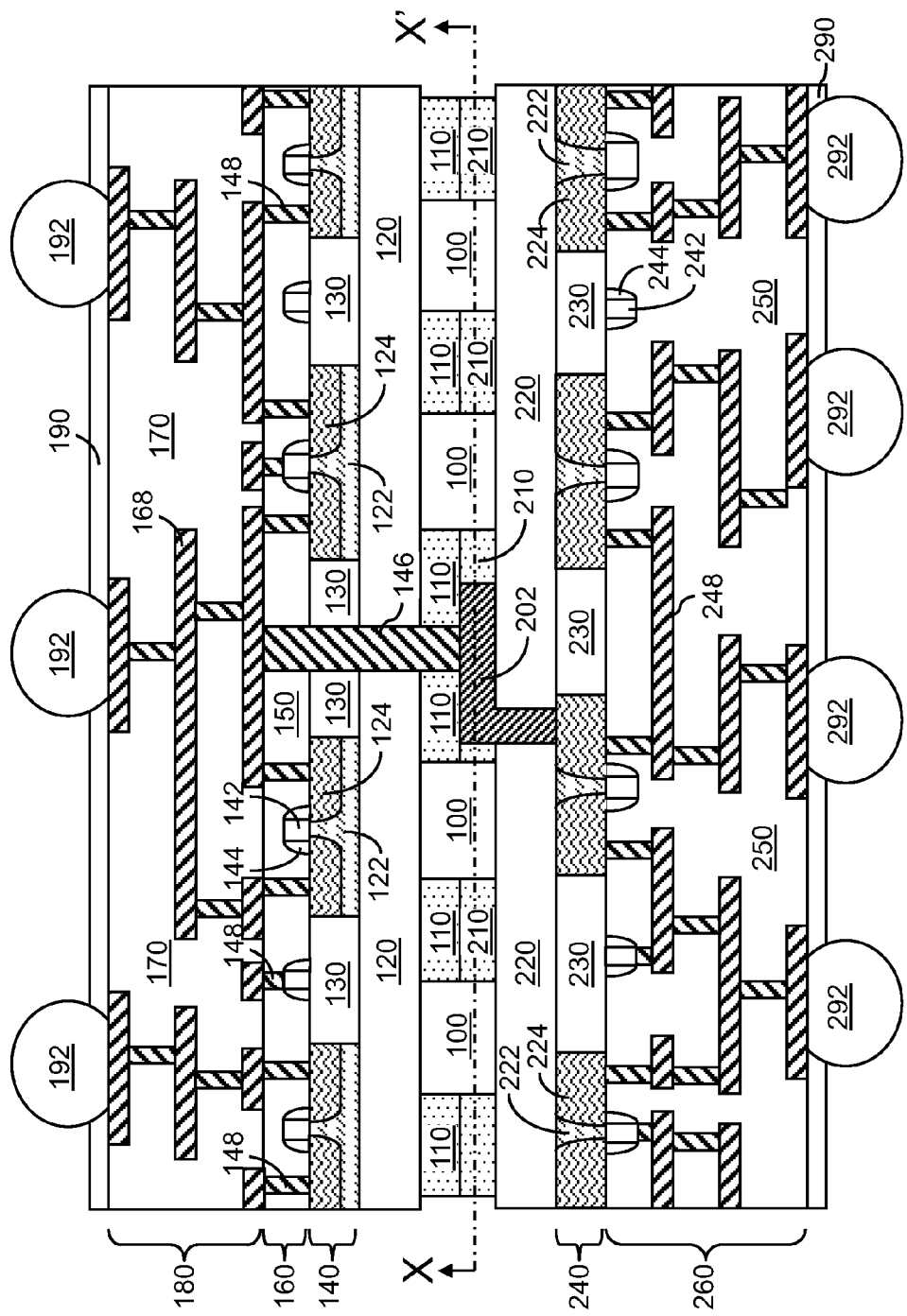
Figure 14:
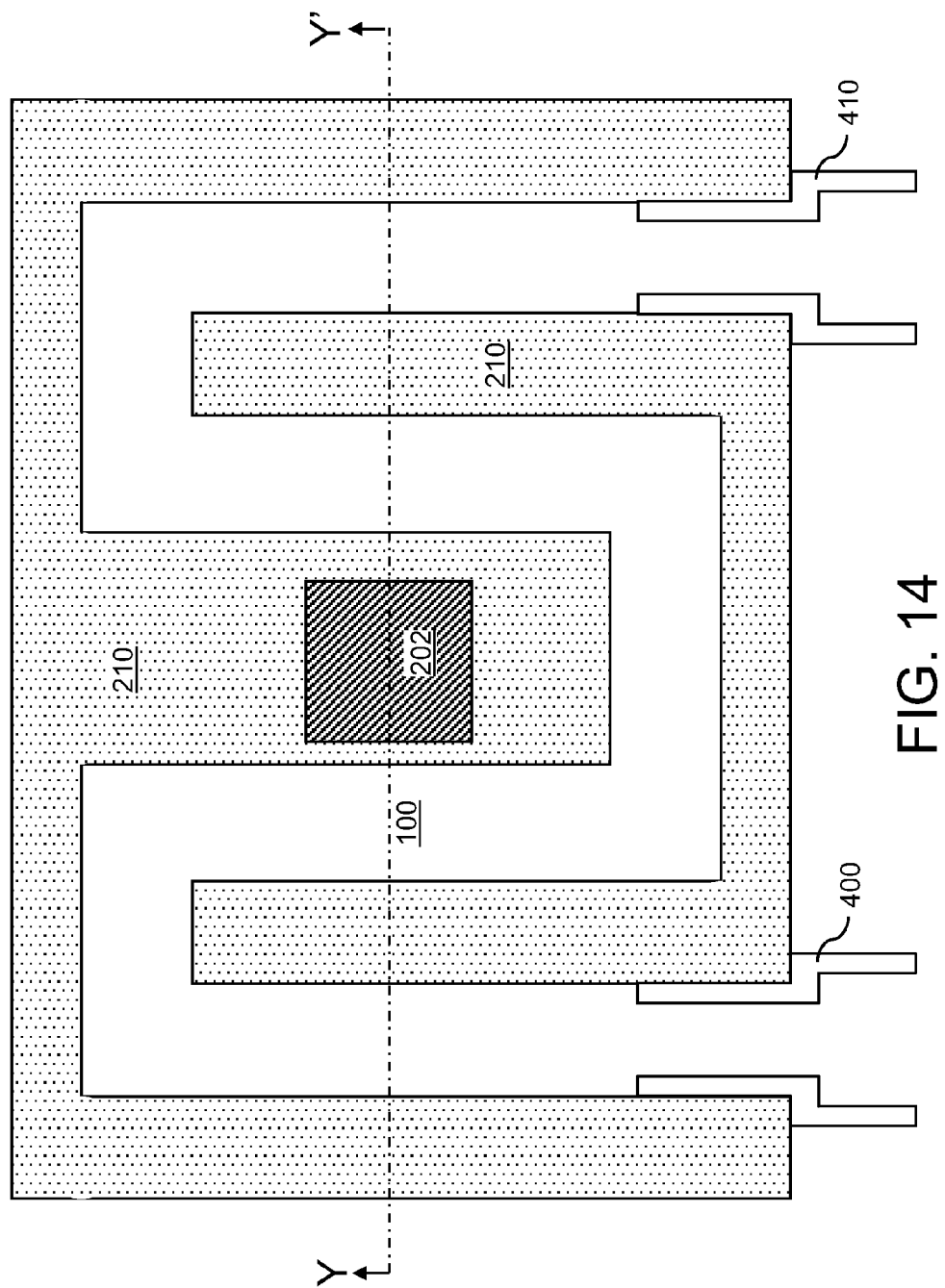
FIG. 14 is a horizontal cross-sectional view of the second exemplary semiconductor structure along the plane X-X' of FIG. 13. The plane Y-Y' in FIG. 14 represents the plane of the vertical cross-sectional view of FIG. 13.

Referring to FIGS. 13 and 14, the bottom handle substrate 296 is removed off the second passivation layer 290. A second set of C4 balls 292 may be formed on an exposed second set of C4 pads as in the first embodiment. An inlet tube 400 and an outlet tube 410 may be attached to the contiguous cavity 100 to facilitate connection to a cooling fluid supply line (not shown) and a cooling fluid return line (not shown), which are connected to a cooling fluid circulator (not shown) and an optional heat radiator. A cooling fluid is supplied into the contiguous cavity 100 and circulated through the contiguous cavity 100 during operation of the semiconductor devices in the bonded semiconductor substrate in the same manner as in the first embodiment.

Figure 15:
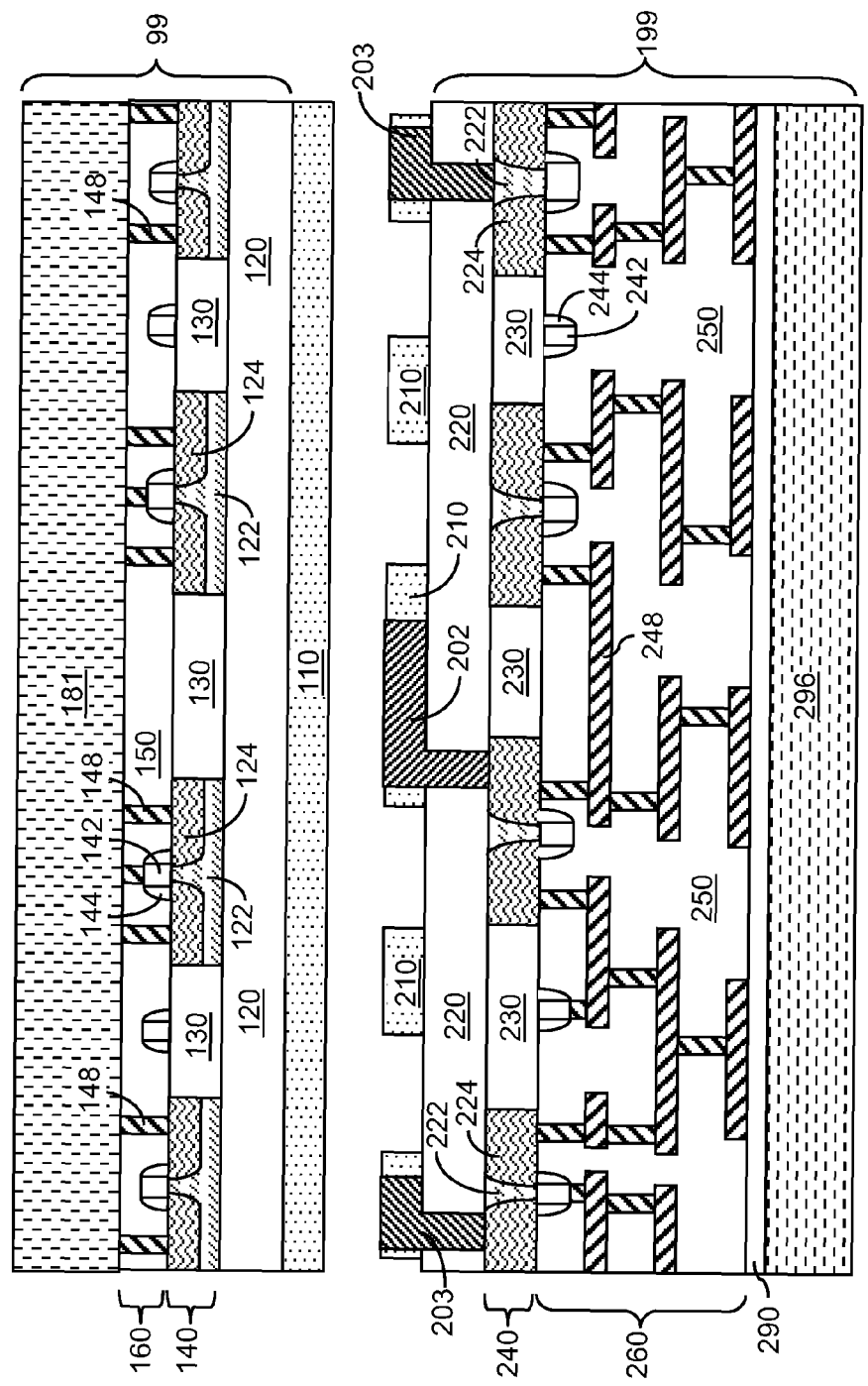
FIGS. 15, 16, 18, and 19 are sequential vertical cross-sectional views of a third exemplary semiconductor structure according to a third embodiment of the present invention at various stages of a manufacturing process.

Referring to FIG. 15, a third exemplary structure according to a third embodiment of the present invention comprises a first structure 99 and a second structure 199, which may be the same as in the first embodiment. After flipping the first structure 99 upside down, a first dielectric layer 110 is applied to the bottom surface of the first insulator layer 120 or to the bottom surface of the first semiconductor substrate 140 in the same manner as in the first embodiment. The first dielectric layer 110 comprises a bondable material that may be employed for bonding purposes. The first dielectric layer 110 is lithographically patterned to include a contiguous channel embedded in the first dielectric layer 110 and having a first lateral opening at a first end of the contiguous channel and a second lateral opening at a second end of the contiguous channel. The stack of the first structure 99 and the first dielectric layer 110 is flipped upside down so that the first dielectric layer 110 is located underneath the first structure 99.

A bottom handle substrate 296 is attached to the top surface of the passivation layer 290, for example, by bonding, in the same manner as in the first embodiment. At least one conductive structure 202 and at least one conductive wiring structure 203 are formed on the second insulator layer 220. The at least one conductive structure 202 and at least one conductive wiring structure 203 are formed by lithographic patterning of via holes in the second insulator layer 220 that extend to top portions of the at least one second semiconductor device in and beneath the second semiconductor substrate 240. For example, the via holes may extend to an upper surface of the second semiconductor substrate 240, which is the bottom surface of the second semiconductor substrate 240 as positioned upside down. A conductive material is deposited into the via holes and on the upper surface of the second insulator layer 220 or the second semiconductor substrate 240 in the same manner as in the second embodiment. Each of the at least one conductive wiring structure 203 provides a resistive electrical connection, i.e., conductive wiring, between one of the at least one second semiconductor device and another of the at least one second semiconductor device in the second semiconductor substrate 240.

A second dielectric layer 210 is applied over the second insulator layer 220 or the first semiconductor substrate 140. The second dielectric layer 210 may be subsequently planarized so that the top surface of the second dielectric layer 210 is substantially coplanar with the top surface(s) of the at least one conductive structure 202. The second dielectric layer 210 comprises a bondable material that may be employed for bonding purposes as in the first and embodiments. The second dielectric layer 210 is lithographically patterned to include a contiguous channel embedded in the second dielectric layer 210 and having a third lateral opening at a first end of the contiguous channel and a fourth lateral opening at a second end of the contiguous channel. Each of the at least one conductive structure 202 and at least one conductive wiring structure 203 is laterally embedded in the second dielectric layer 210. In one case, the pattern in the second dielectric layer 210 is a mirror image of the pattern in the first dielectric layer 110 so that the sidewalls of the second dielectric layer 210 and the first dielectric layer 110 are substantially vertically coincident when the second dielectric layer 210 and the first dielectric layer 110 are brought together.

Figure 16:
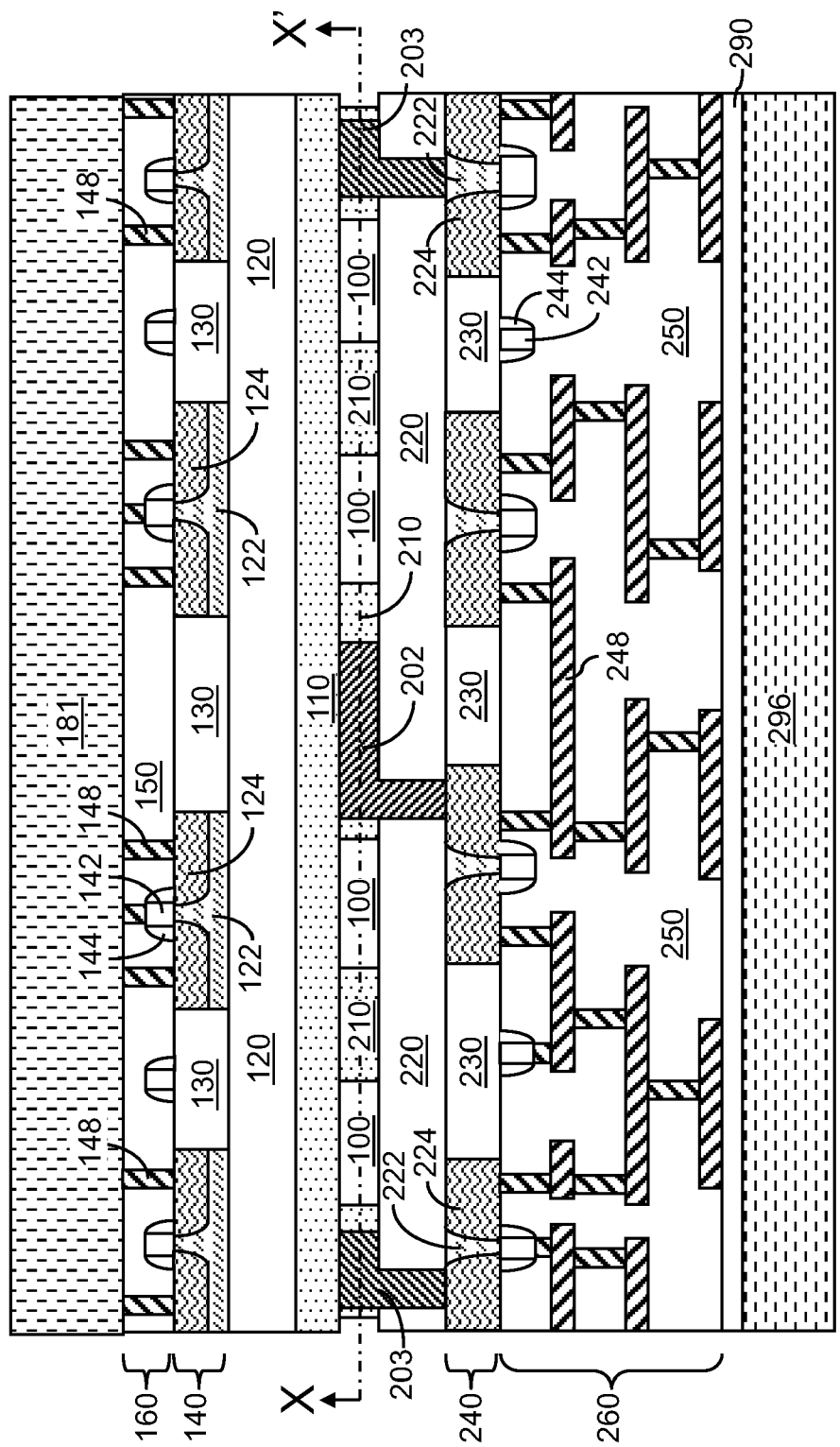
Figure 17:
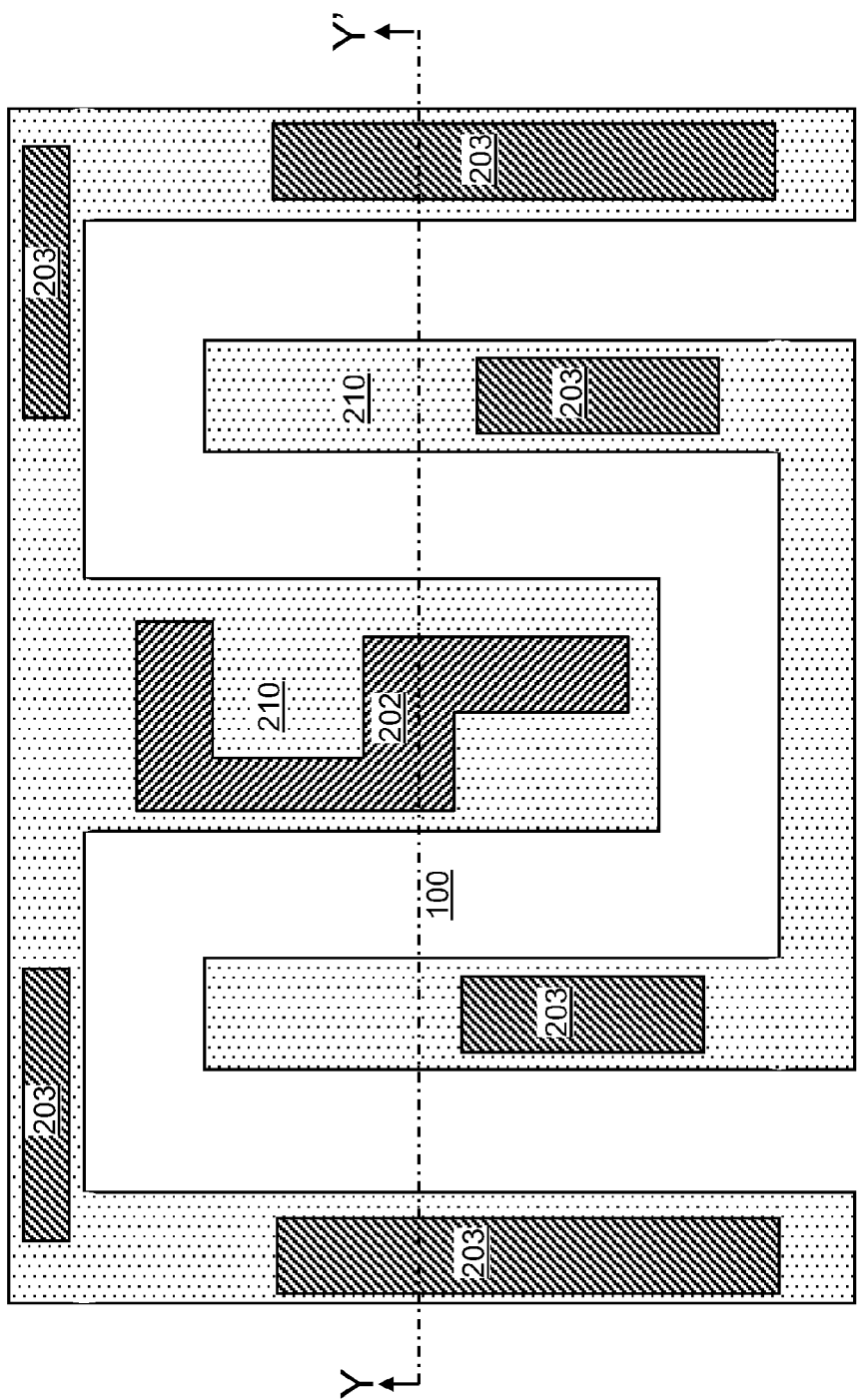
FIG. 17 is a horizontal cross-sectional view of the third exemplary semiconductor structure along the plane X-X' of FIG. 16. The plane Y-Y' in FIG. 17 represents the plane of the vertical cross-sectional view of FIG. 16.

Referring to FIGS. 16 and 17, the first structure 99 and the second structure 199 are bonded through the first dielectric layer 110 and the second dielectric layer 210 in the same manner as in the first embodiment. The first structure 99, the second structure 199, the first dielectric layer 110, and the second dielectric layer 210 collectively constitute a bonded substrate. The top surface of the second dielectric layer 210 is bonded to the top surface of the first dielectric layer 110 as positioned upside down. When the second dielectric layer 210 and the first dielectric layer 110 are brought together, the patterns in the second dielectric layer 210 and the first dielectric layer 110 are aligned so that the two channels form an contiguous cavity 100 vertically bounded by an upper surface of the first dielectric layer 110 and a lower surface of the second dielectric layer 210. The contiguous cavity 100 is laterally bounded by sidewalls of the first dielectric layer 110 and a lower surface of the second dielectric layer 210. The contiguous cavity 100 has the same geometric features as the continuous cavity 100 in the first embodiment. Embodiments are explicitly contemplated in which only one of the first dielectric layer 110 and the second dielectric layer 210 is employed to bond the first structure 99 and the second structure 199.

Figure 18:
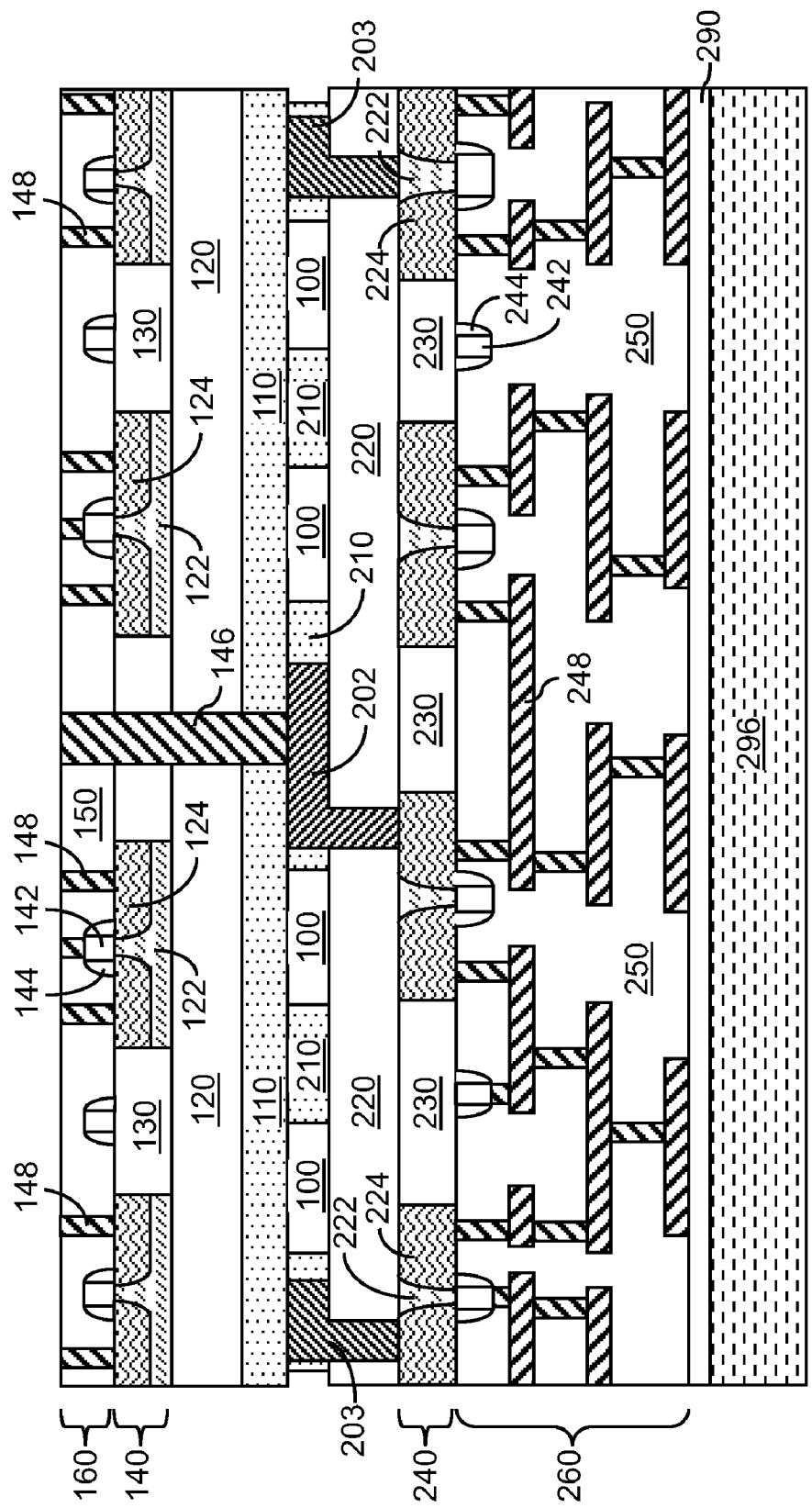

Referring to FIG. 18, the top handle substrate 181 is removed from the top surface of the substrate-contact level metal interconnect structure 160. Through-substrate vias 146 are formed in the same manner as in the second embodiment. The through substrate vias 146 and the at least one conductive structure 202 collectively constitute conductive electrical connections between the at least one first semiconductor device and the at least one second semiconductor device.

Figure 19:
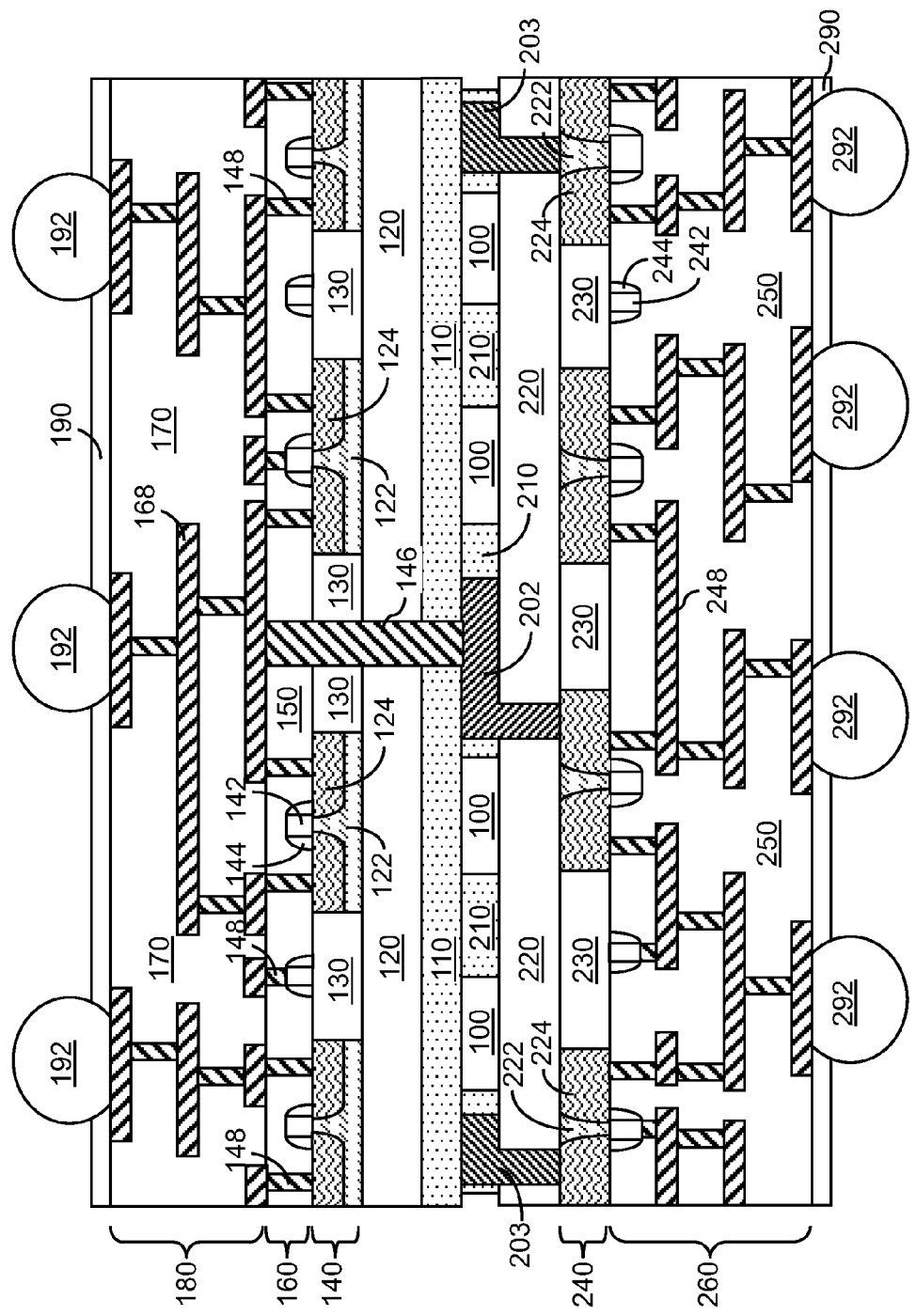
Figure 20:
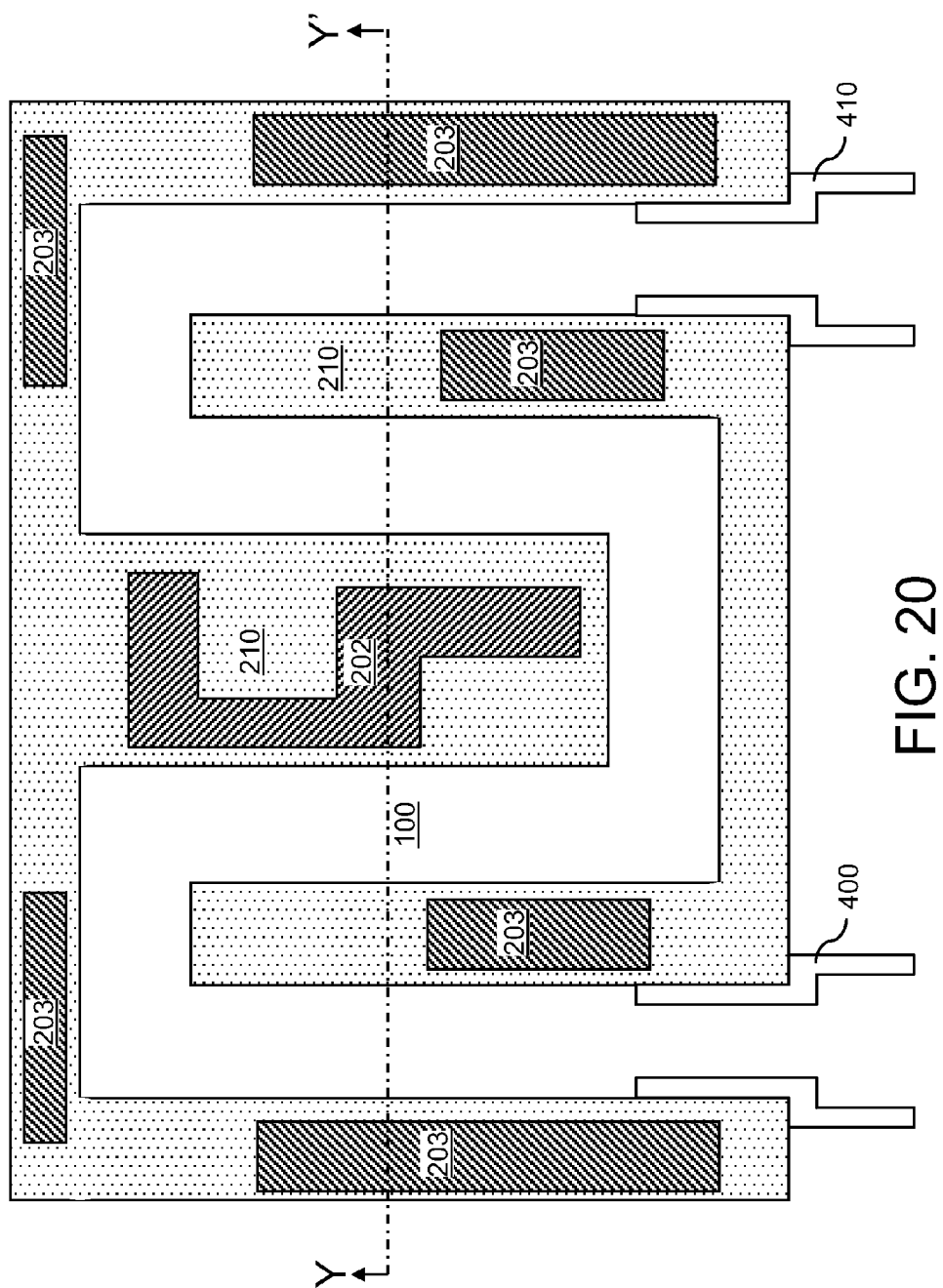
FIG. 20 is a horizontal cross-sectional view of the third exemplary semiconductor structure along the plane X-X' of FIG. 19. The plane Y-Y' in FIG. 20 represents the plane of the vertical cross-sectional view of FIG. 19.

Referring to FIGS. 19 and 20, a first metal interconnect structure 180 is formed directly on the substrate-contact level metal interconnect structure 160 in the same manner as in the first and second embodiments. The first metal wiring structures 168 may include a first set of Controlled Collapse Chip Connection (C4) pads located directly underneath the first passivation layer 190 as in the first embodiment. A first set of C4 balls 192 may be formed on the exposed first set of C4 pads as in the first embodiment. The bottom handle substrate 296 is then removed off the second passivation layer 290. A second set of C4 balls 292 may be formed on an exposed second set of C4 pads as in the first and second embodiments. An inlet tube 400 and an outlet tube 410 may be attached to the contiguous cavity 100 to facilitate connection to a cooling fluid supply line (not shown) and a cooling fluid return line (not shown), which are connected to a cooling fluid circulator (not shown) and an optional heat radiator. A cooling fluid is supplied into the contiguous cavity 100 and circulated through the contiguous cavity 100 during operation of the semiconductor devices in the bonded semiconductor substrate in the same manner as in the first and second embodiments.

Figure 21:
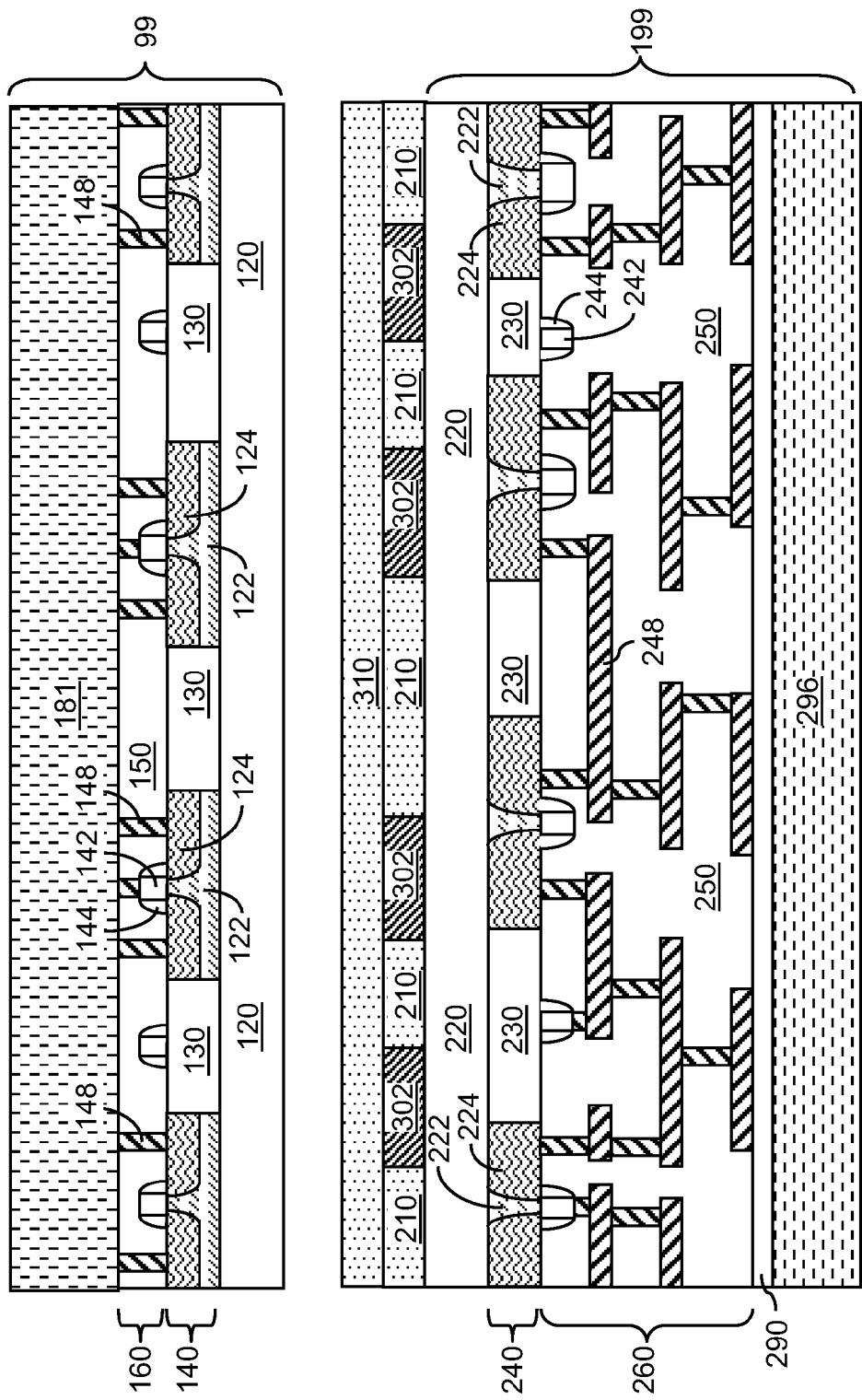
FIGS. 21, 22, 24-26 are sequential vertical cross-sectional views of a fourth exemplary semiconductor structure according to a fourth embodiment of the present invention at various stages of a manufacturing process.

Referring to FIG. 21, a fourth exemplary structure according to a fourth embodiment of the present invention comprises a first structure 99 and a second structure 199, which may be the same as in the first through third embodiments. A conductive fin 302 having a first end portion and a second end portion and a middle portion connecting the first end portion and the second end portion. The conductive fin 302 may be formed by deposition of a conductive material directly on the upper surface of the second insulator layer 220, followed by lithographic patterning. The conductive fin 302 may comprise a semiconductor material such as doped polysilicon or a doped silicon-containing alloy, or may comprise a metallic material such as Cu, W, Al, Ti, Ta, Co, Ni, TaN, TiN, etc. The conductive fin 302 is of integral and unitary construction, i.e., in the shape of a single contiguous piece without any interface therein. The conductive fin 302 may include bends, and may include regions having a constant cross-sectional area. The conductive fin 302 is configured allow heat transfer from the middle portion to the first end portion and/or the second end portion. The thickness of the conductive fin 302 may be from about 100 nm to about 10 µm, and typically from about 400 nm to about 4 µm, although lesser and greater thicknesses are also contemplated herein.

A second dielectric layer 210 is applied over the conductive fin 302 and one of the second insulator layer 220 and the first semiconductor substrate 140. The second dielectric layer 210 may be subsequently planarized so that the top surface of the second dielectric layer 210 is substantially coplanar with the top surface of the conductive fin 302. The second dielectric layer 210 comprises a bondable material that may be employed for bonding purposes as in the first through third embodiments.

In one case, a first dielectric material layer 310 is applied over the second dielectric material layer 210. The first dielectric layer 310 comprises a bondable material, and may comprise any of the materials that may be employed for the first dielectric layer 110 in the first through third embodiments. The thickness of the first dielectric material layer 310 may be from about 50 nm to about 5 µm, and typically from about 200 nm to about 2 µm, although lesser and greater thicknesses are also contemplated herein.

In another case, the first structure 99 is flipped upside down, and a first dielectric layer 310 is applied to the bottom surface of the first insulator layer 120 or to the bottom surface of the first semiconductor substrate 140 in the same manner as in the first through third embodiments. The first dielectric layer 310 comprises the same bondable material as the first dielectric material layer 110 of the first through third embodiments. The thickness of the first dielectric material layer 310 may be from about 50 nm to about 5 µm, and typically from about 200 nm to about 2 µm, although lesser and greater thicknesses are also contemplated herein.

Preferably, the second dielectric material layer 210 and/or the first dielectric material layer 310 are lithographically patterned to expose the first end portion and the second end portion of the conductive fin 302, while the middle portion of the conductive fin 302 is embedded in the second dielectric layer 210. Thus, the first end portion and the second end portion of the conductive fin 302 protrude out of the sidewalls of the second dielectric material layer 210 and/or the sidewalls of the first dielectric material layer 310.

Figure 22:
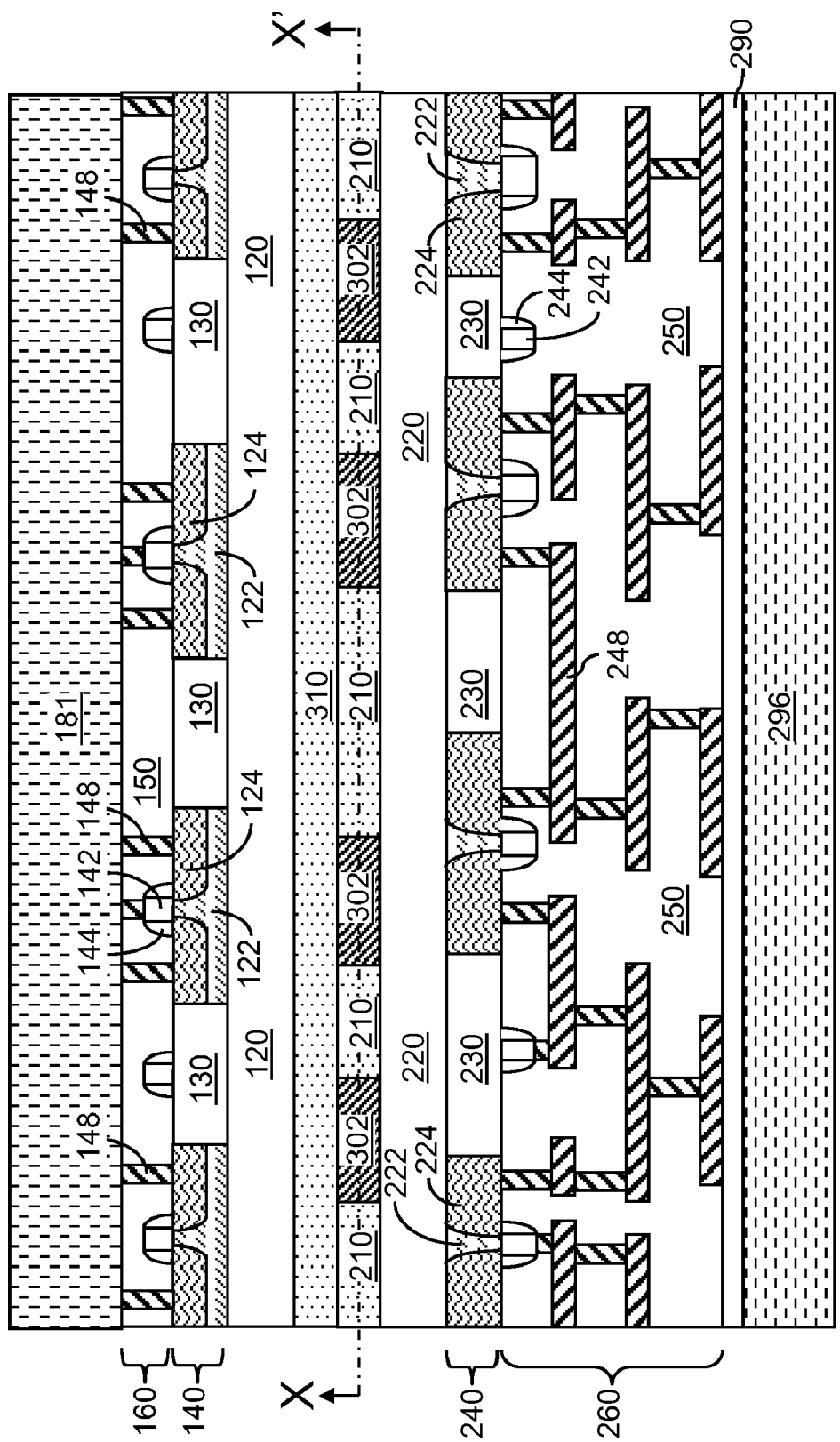
Figure 23:
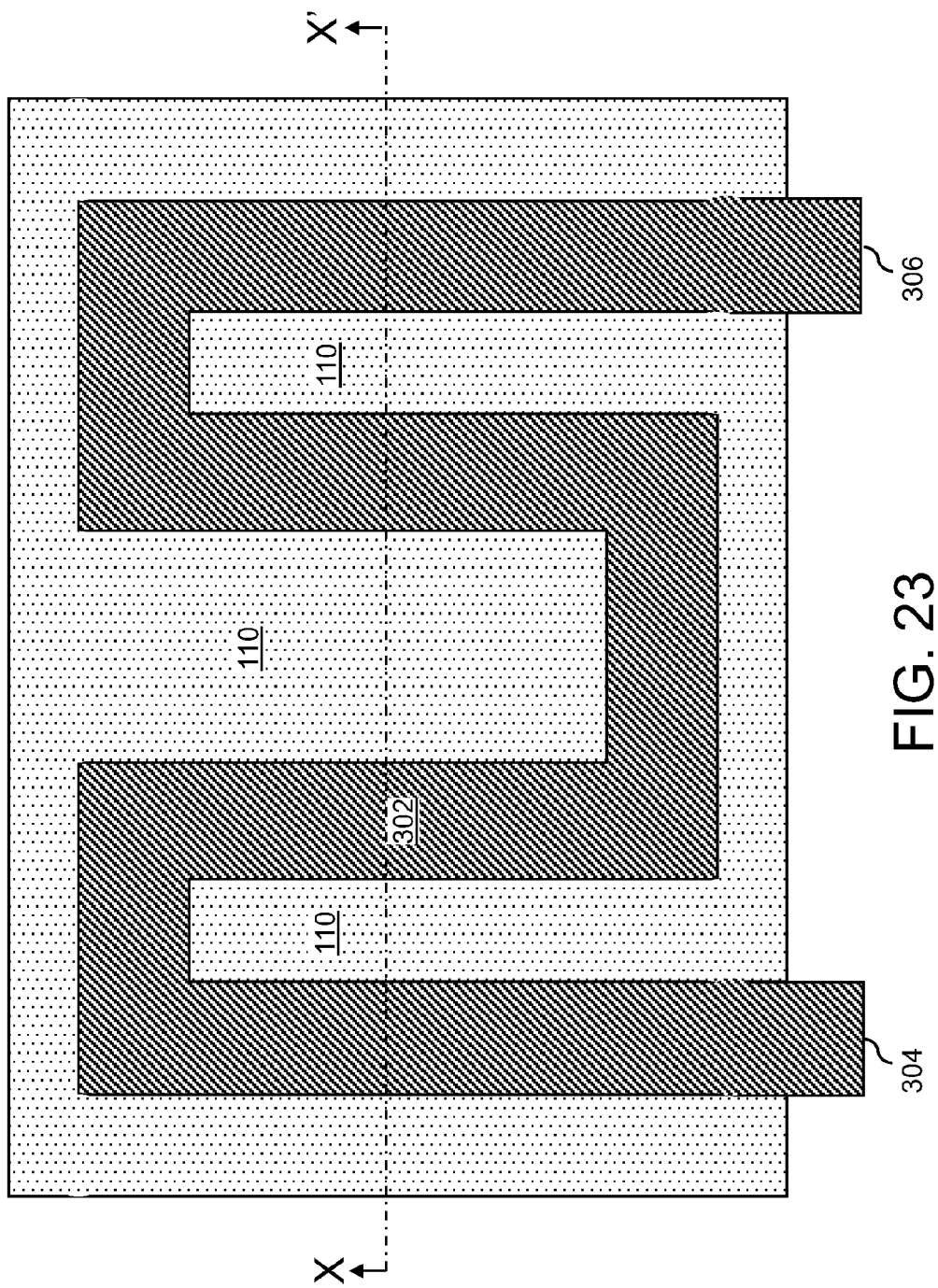
FIG. 23 is a horizontal cross-sectional view of the fourth exemplary semiconductor structure along the plane X-X' of FIG. 22. The plane Y-Y' in FIG. 23 represents the plane of the vertical cross-sectional view of FIG. 22.

Referring to FIGS. 22 and 23, the first structure 99 and the second structure 199 are bonded through the first dielectric layer 310 and the second dielectric layer 210. In one case, the bonding interface may be between the bottom surface of the first insulator layer 120 and the top surface of the first dielectric layer 310 as deposited directly on the top surface of the second dielectric layer 210. In another case, the bonding interface may be between the top surface of the second dielectric layer 210 and the top surface of the first dielectric layer 310 as positioned upside down in the same manner as in the first through third embodiments. The first structure 99, the second structure 199, the first dielectric layer 310, the second dielectric layer 210, and the conductive fin 302 collectively constitute a bonded substrate. Embodiments are explicitly contemplated in which only the second dielectric layer 210 is employed to bond the first structure 99 and the second structure 199 without employing the first dielectric layer 110.

Figure 24:
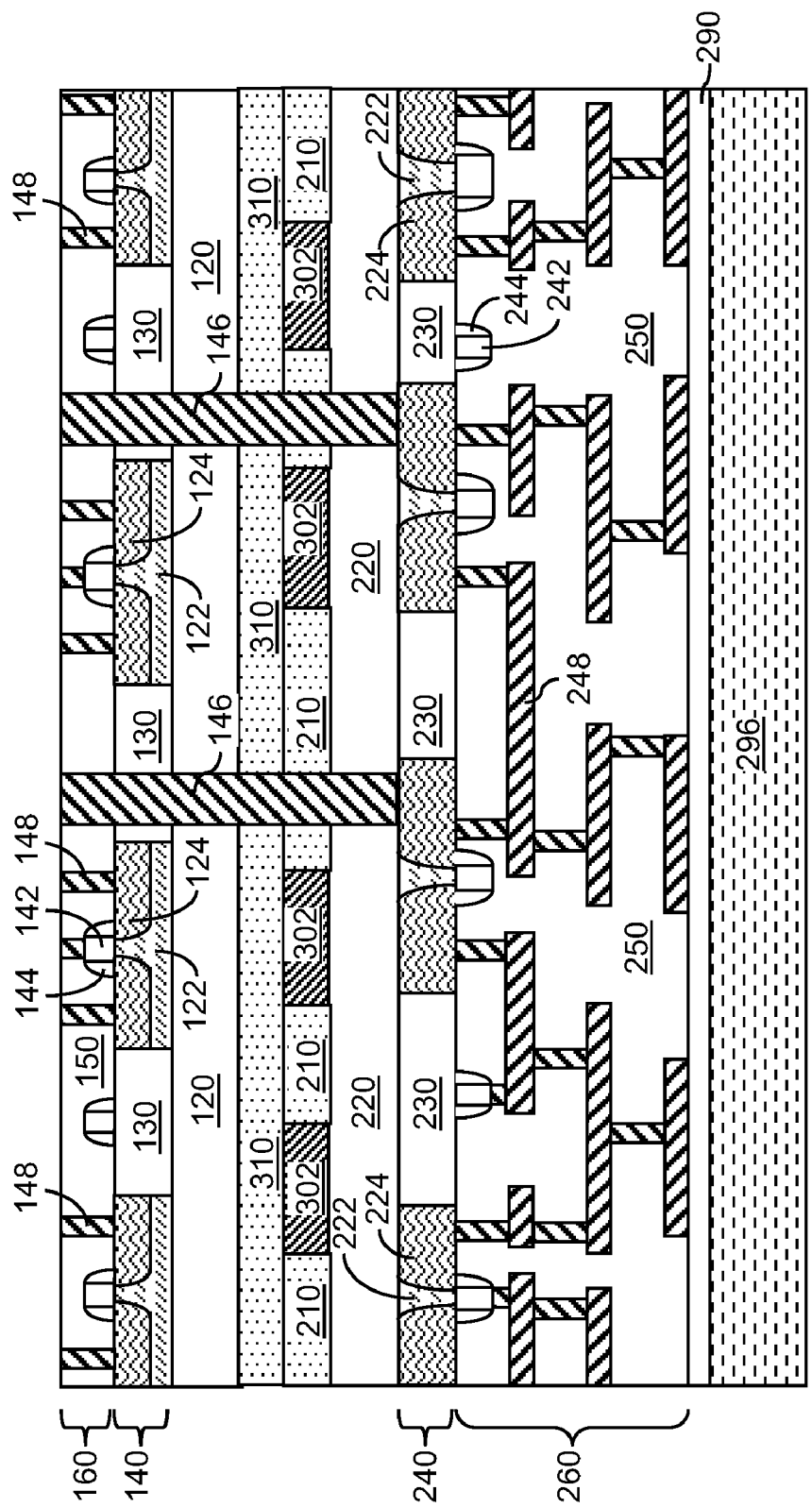

Referring to FIG. 24, the top handle substrate 181 is removed from the top surface of the substrate-contact level metal interconnect structure 160. Through-substrate vias 146 are formed in the same manner as in the second embodiment. The through substrate vias 146 constitute conductive electrical connections between the at least one first semiconductor device and the at least one second semiconductor device.

Figure 25:
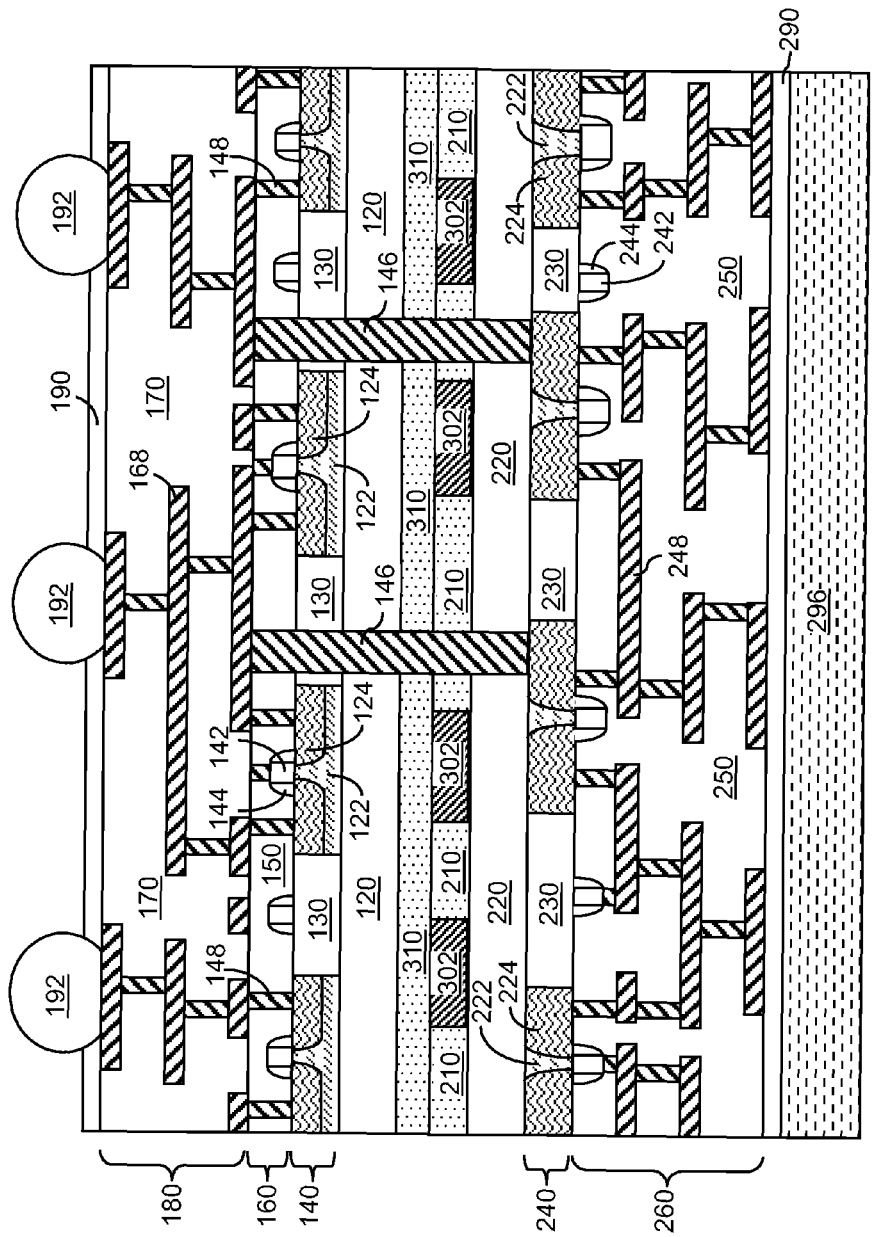

Referring to FIG. 25, a first metal interconnect structure 180 is formed directly on the substrate-contact level metal interconnect structure 160 in the same manner as in the first and second embodiments. The first metal wiring structures 168 may include a first set of Controlled Collapse Chip Connection (C4) pads located directly underneath the first passivation layer 190 as in the first embodiment. A first set of C4 balls 192 may be formed on the exposed first set of C4 pads as in the first embodiment.

Figure 26:
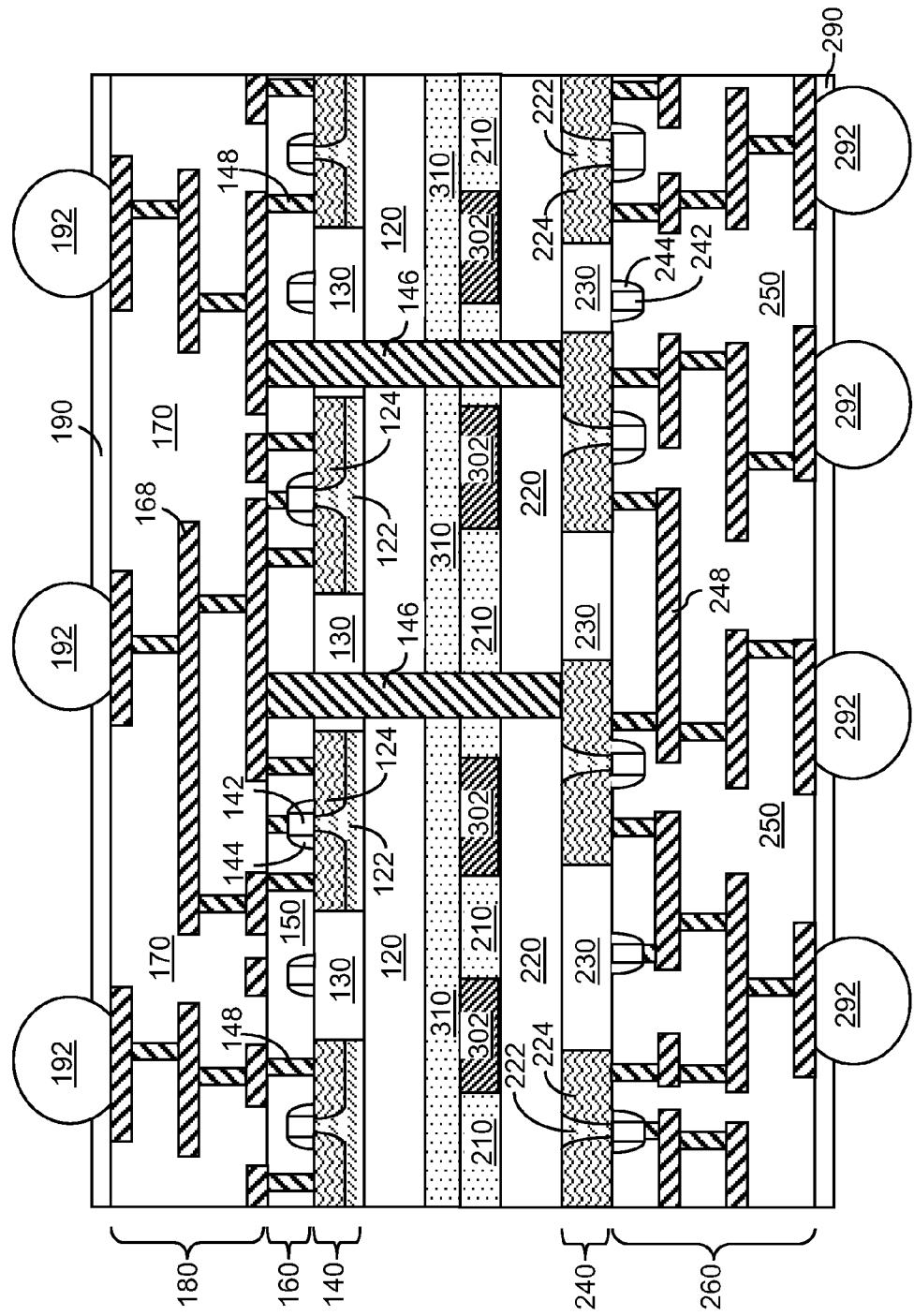

Referring to FIG. 26, the bottom handle substrate 296 is then removed off the second passivation layer 290. A second set of C4 balls 292 may be formed on an exposed second set of C4 pads as in the first and second embodiments. The first end portion and the second end portion of the conductive fin 302 are connected to a heat sink structure so that heat generated by semiconductor devices in the first and second semiconductor substrates (140, 240) are transferred through the middle portion, which is the embedded portion, of the conductive fin 302 through the first and second end portions of the conductive fin 302, and then to the heat sink structure.

Figure 27:
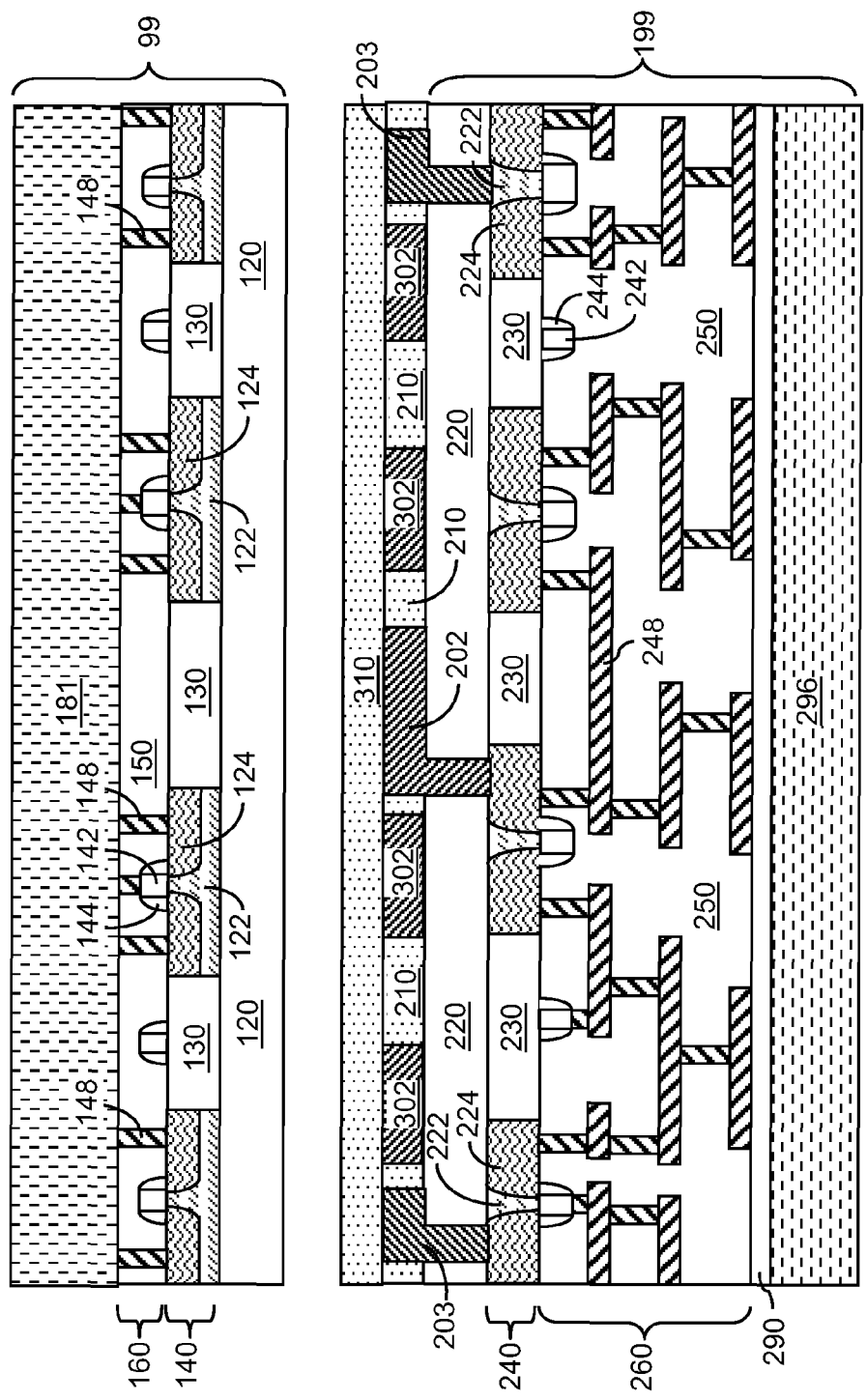
FIGS. 27, 28, 30 and 31 are sequential vertical cross-sectional views of a fifth exemplary semiconductor structure according to a fifth embodiment of the present invention at various stages of a manufacturing process.

Referring to FIG. 27, a fifth exemplary structure according to a fifth embodiment of the present invention comprises a first structure 99 and a second structure 199, which may be the same as in the first through fourth embodiments.

A conductive fin 302, at least one conductive structure 202, and at least one conductive wiring structure 203 are formed on the second insulator layer 220. The at least one conductive structure 202 and the at least one conductive wiring structure 203 are formed by lithographic patterning of via holes in the second insulator layer 220 that extend to top portions of the at least one second semiconductor device in and beneath the second semiconductor substrate 240. For example, the via holes may extend to an upper surface of the second semiconductor substrate 240, which is the bottom surface of the second semiconductor substrate 240 as positioned upside down. A conductive material is deposited into the via holes and on the upper surface of the second insulator layer 220 or the second semiconductor substrate 240 in the same manner as in the second and third embodiments. The conductive material is lithographically patterned to form the conductive fin 302, the at least one conductive structure 202, and the at least one conductive wiring structure 203. The conductive fin 302 may have the same structure and composition as in the fourth embodiment. The at least one conductive structure 202 and the at least one conductive wiring structure 203 has the same composition as the conductive fin 302, and has the same structural and functional characteristics as the at least one conductive structure 202 and the at least one conductive wiring structure 203 of the third embodiment. Each of the at least one conductive wiring structure 203 provides a resistive electrical connection, i.e., conductive wiring, between one of the at least one second semiconductor device and another of the at least one second semiconductor device in the second semiconductor substrate 240.

In one case, a first dielectric material layer 310 is applied over the second dielectric material layer 210. The first dielectric layer 310 comprises a bondable material, and may comprise any of the material that may be employed for the first dielectric layer 110 in the first through third embodiments. The thickness of the first dielectric material layer 310 may be from about 50 nm to about 5 µm, and typically from about 200 nm to about 2 µm, although lesser and greater thicknesses are also contemplated herein.

In another case, the first structure 99 is flipped upside down, and a first dielectric layer 310 is applied to the bottom surface of the first insulator layer 120 or to the bottom surface of the first semiconductor substrate 140 in the same manner as in the first through third embodiments. The first dielectric layer 310 comprises the same bondable material as the first dielectric material layer 110 of the first through third embodiments. The thickness of the first dielectric material layer 310 may be from about 50 nm to about 5 µm, and typically from about 200 nm to about 2 µm, although lesser and greater thicknesses are also contemplated herein.

Preferably, the second dielectric material layer 210 and/or the first dielectric material layer 310 are lithographically patterned to expose the first end portion and the second end portion of the conductive fin 302, while the middle portion of the conductive fin 302 is embedded in the second dielectric layer 210. Thus, the first end portion and the second end portion of the conductive fin 302 protrude out of the sidewalls of the second dielectric material layer 210 and/or the sidewalls of the first dielectric material layer 310.

Figure 28:
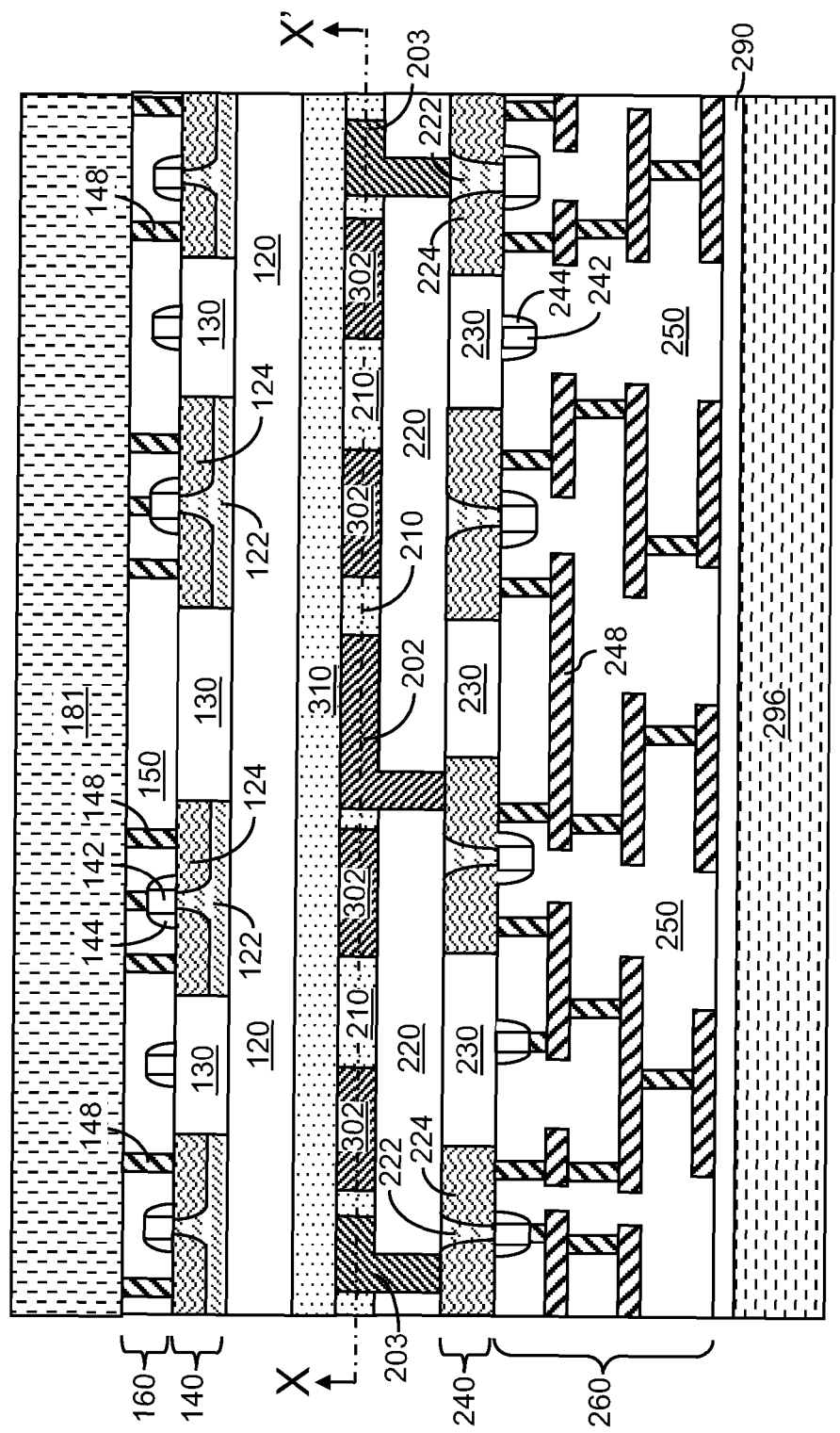
Figure 29:
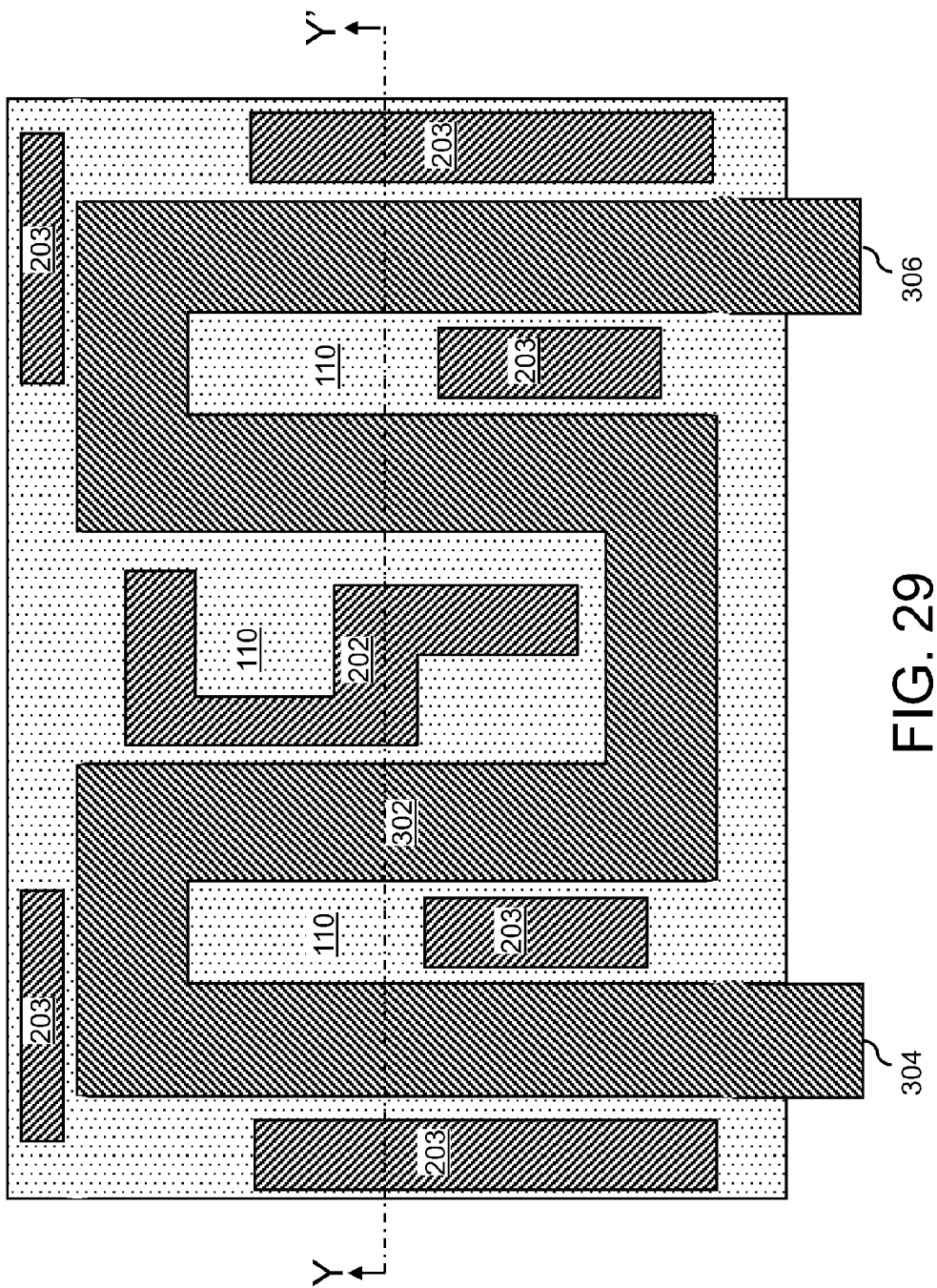
FIG. 29 is a horizontal cross-sectional view of the fifth exemplary semiconductor structure along the plane X-X' of FIG. 28. The plane Y-Y' in FIG. 29 represents the plane of the vertical cross-sectional view of FIG. 28.

Referring to FIGS. 28 and 29, the first structure 99 and the second structure 199 are bonded through the first dielectric layer 310 and the second dielectric layer 210. In one case, the bonding interface may be between the bottom surface of the first insulator layer 120 and the top surface of the first dielectric layer 310 as deposited directly on the top surface of the second dielectric layer 210. In another case, the bonding interface may be between the top surface of the second dielectric layer 210 and the top surface of the first dielectric layer 310 as positioned upside down in the same manner as in the first through third embodiments. The first structure 99, the second structure 199, the first dielectric layer 310, the second dielectric layer 210, the conductive fin 302, and the at least one conductive structure 202, and the at least one conductive wiring structure 203 collectively constitute a bonded substrate. Embodiments are explicitly contemplated in which only the second dielectric layer 210 is employed to bond the first structure 99 and the second structure 199 without employing the first dielectric layer 110.

Figure 30:
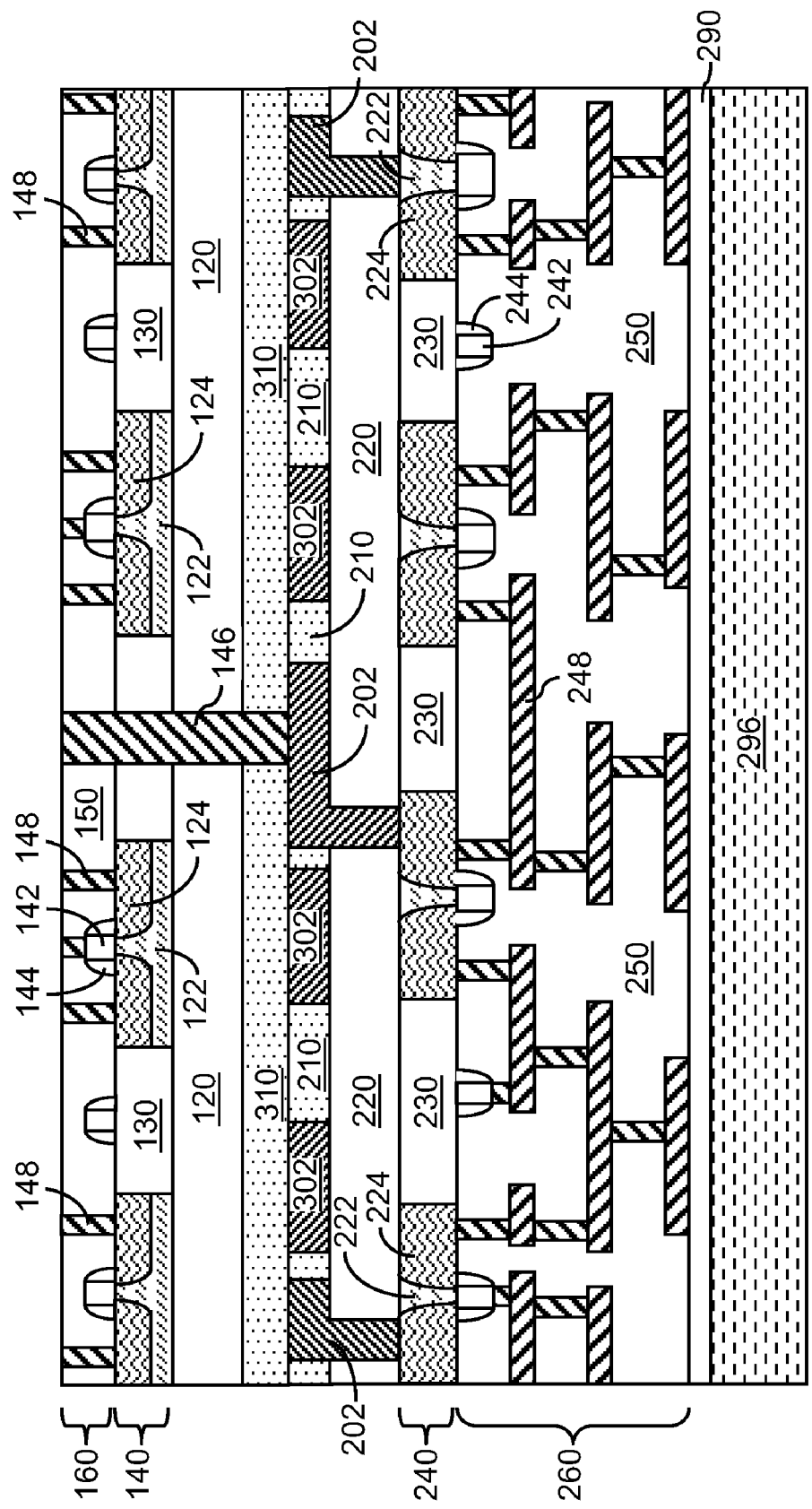

Referring to FIG. 30, the top handle substrate 181 is removed from the top surface of the substrate-contact level metal interconnect structure 160. Through-substrate vias 146 are formed in the same manner as in the second and third embodiments. The through substrate vias 146 and the at least one conductive structure 202 collectively constitute conductive electrical connections between the at least one first semiconductor device and the at least one second semiconductor device.

Figure 31:
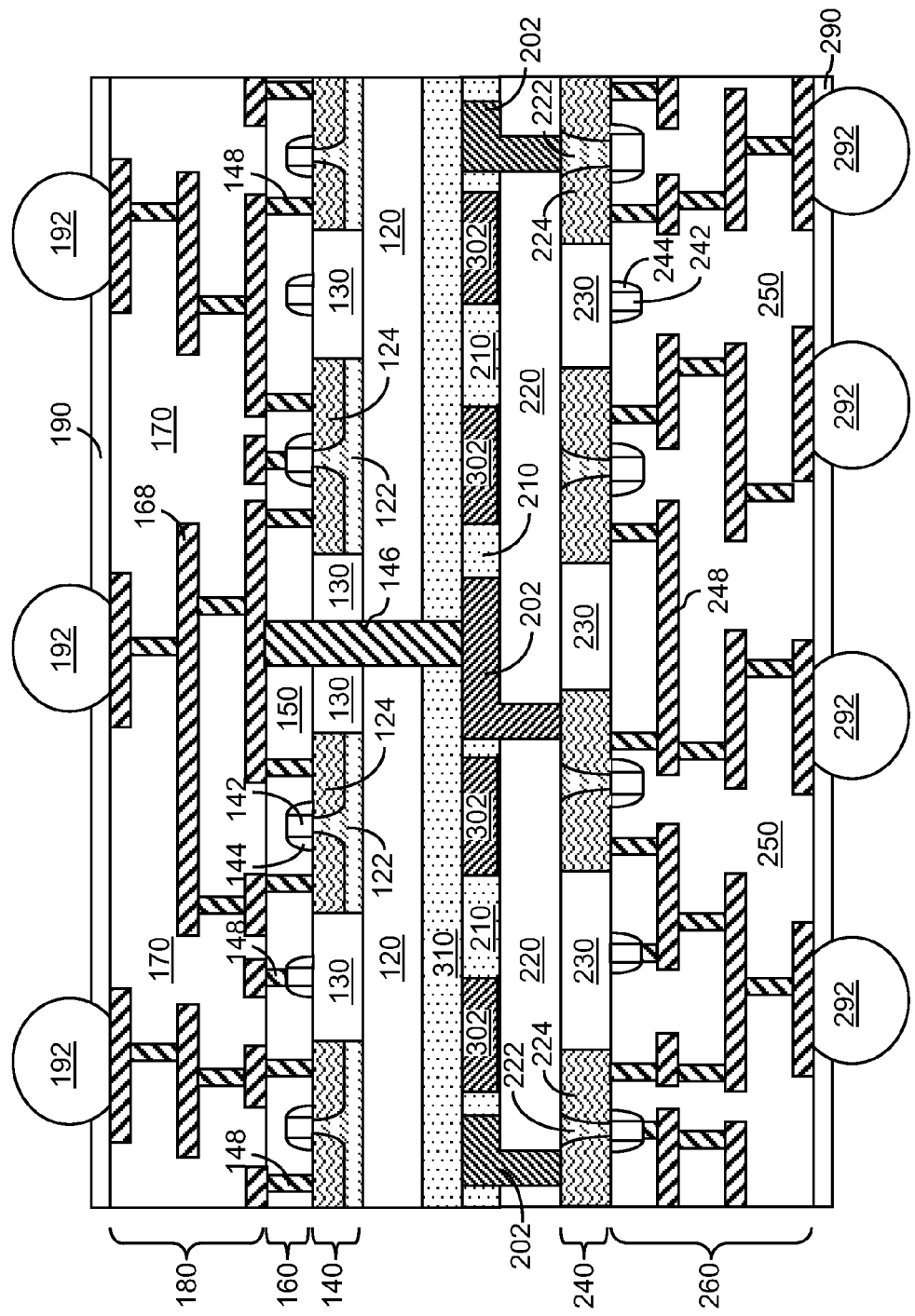

Referring to FIG. 31, a first metal interconnect structure 180 is formed directly on the substrate-contact level metal interconnect structure 160 in the same manner as in the first and second embodiments. The first metal wiring structures 168 may include a first set of Controlled Collapse Chip Connection (C4) pads located directly underneath the first passivation layer 190 as in the first embodiment. A first set of C4 balls 192 may be formed on the exposed first set of C4 pads as in the first embodiment. The bottom handle substrate 296 is then removed off the second passivation layer 290. A second set of C4 balls 292 may be formed on an exposed second set of C4 pads as in the first and second embodiments. The first end portion and the second end portion of the conductive fin 302 are connected to a heat sink structure so that heat generated by semiconductor devices in the first and second semiconductor substrates (140, 240) are transferred through the middle portion, which is the embedded portion, of the conductive fin 302 through the first and second end portions of the conductive fin 302, and then to the heat sink structure.

Figure 32:
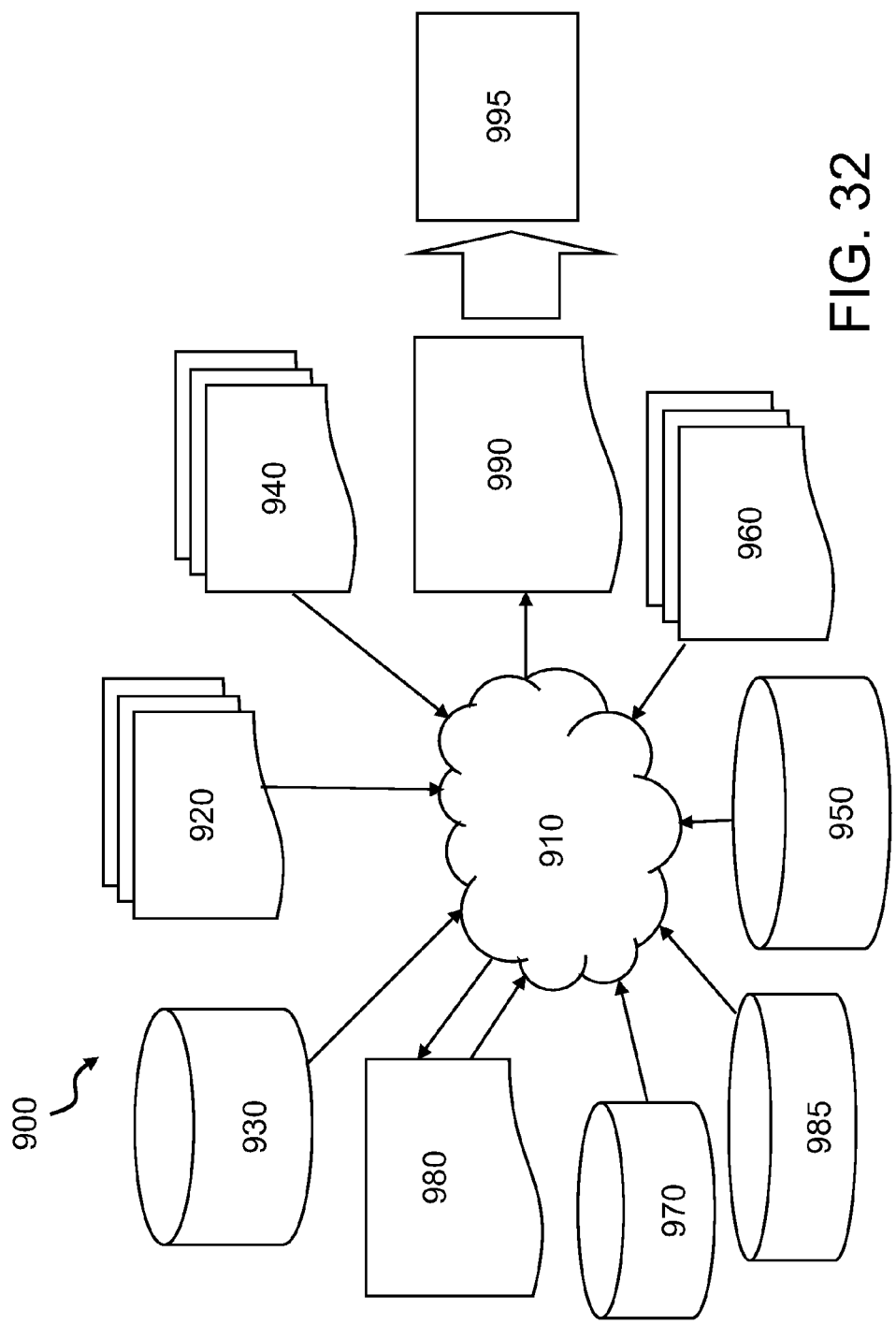
FIG. 32 is a flow diagram of a design process that may be used in design and manufacture of the semiconductor devices and circuits according to the present invention.

FIG. 32 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-31. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 32 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-31. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-31 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-31. In one embodiment, design structure 990 may comprise a compiled, executable HDL simulation model that functionally simulates the devices shown in FIGS. 1-31.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-31. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   providing a first structure including a first semiconductor substrate having at least one first semiconductor device thereupon;
   providing a second structure including a second semiconductor substrate having at least one second semiconductor device thereupon;
   forming a first dielectric material layer directly on said first structure;
   forming a second dielectric material layer directly on said second structure;
   patterning said second dielectric material layer to form a contiguous channel having a first lateral opening and a second lateral opening; and
   bonding said first dielectric material layer and said second dielectric material layer.

2. A method of forming a semiconductor structure comprising:
   providing a first structure including a first semiconductor substrate having at least one first semiconductor device thereupon;
   providing a second structure including a second semiconductor substrate having at least one second semiconductor device thereupon;
   forming a conductive fin directly on said second structure;
   forming a second dielectric material layer directly on said second structure, wherein said conductive fin has a first end portion and a second end portion and an embedded portion therebetween, and wherein said embedded portion is embedded in said second dielectric material layer;
   forming a first dielectric material layer directly on said first structure or directly on said second dielectric material layer; and
   bonding said first dielectric material layer and said second dielectric material layer.

* * * * *